United States Patent
Li et al.

(10) Patent No.: US 11,997,893 B2
(45) Date of Patent: May 28, 2024

(54) DISPLAY PANEL AND ELECTRONIC DEVICE

(71) Applicants: Hefei BOE Joint Technology Co., Ltd., Hefei (CN); BOE TECHNOLOGY GROUP CO., LTD., Beijing (CN)

(72) Inventors: Meng Li, Beijing (CN); Min He, Beijing (CN); Ying Wang, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 615 days.

(21) Appl. No.: 17/279,699

(22) PCT Filed: May 15, 2020

(86) PCT No.: PCT/CN2020/090653
§ 371 (c)(1),
(2) Date: Mar. 25, 2021

(87) PCT Pub. No.: WO2021/227065
PCT Pub. Date: Nov. 18, 2021

(65) Prior Publication Data
US 2022/0028954 A1 Jan. 27, 2022

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *H10K 50/865* (2023.02);
(Continued)

(58) Field of Classification Search
CPC ............... G09G 3/32; G09G 3/3225; G09G 2300/0439; H10K 50/865; H10K 59/1201;
(Continued)

(56) References Cited

U.S. PATENT DOCUMENTS 10,978,537 B2    4/2021   Ebisuno et al.
2018/0040682 A1*   2/2018   Ebisuno ............... H10K 59/131
(Continued)

FOREIGN PATENT DOCUMENTS

CN    110718575 A    1/2020
EP    3282482 A1    2/2018
(Continued)

OTHER PUBLICATIONS

Extended European Search Report, for European Patent Application No. 20904244.9, dated Aug. 19, 2022, 10 pages.

*Primary Examiner* — Amy Onyekaba
*Assistant Examiner* — Cory A Almeida
(74) *Attorney, Agent, or Firm* — Westman, Champlin & Koehler, P.A.

(57) ABSTRACT

A display panel includes: a base substrate; and a plurality of pixels on the base substrate, the plurality of pixels including a first pixel and a second pixel. The first pixel includes a first light-transmitting area and a first display area sequentially arranged in a first direction, and the second pixel includes a second light-transmitting area and a second display area sequentially arranged in the first direction. The first pixel and the second pixel are adjacent in a second direction, and the first light-transmitting area and the second light-transmitting area are adjacent in the second direction. The display panel further includes: a first gate line and a second gate line both arranged between the first light-transmitting area and the second light-transmitting area. The first light-transmit-
(Continued)

ting area is contiguous to the first gate line, and the second light-transmitting area is contiguous to the second gate line.

18 Claims, 19 Drawing Sheets

(51) Int. Cl.
*H10K 50/86* (2023.01)
*H10K 59/12* (2023.01)
*H10K 59/122* (2023.01)
*H10K 59/124* (2023.01)
*H10K 59/126* (2023.01)
*H10K 59/38* (2023.01)
*H10K 71/00* (2023.01)

(52) U.S. Cl.
CPC ......... *H10K 59/122* (2023.02); *H10K 59/124* (2023.02); *H10K 59/126* (2023.02); *H10K 59/38* (2023.02); *H10K 71/00* (2023.02); *G09G 2300/0439* (2013.01); *H10K 59/1201* (2023.02)

(58) Field of Classification Search
CPC .. H10K 59/122; H10K 59/124; H10K 59/126; H10K 59/131; H10K 59/38; H10K 71/00
See application file for complete search history.

(56) References Cited

U.S. PATENT DOCUMENTS

2019/0189727 A1 6/2019 Kim et al.
2021/0202646 A1 7/2021 Ebisuno et al.

FOREIGN PATENT DOCUMENTS

JP 2005-77822 A 3/2005
JP 2016-157263 A 9/2016

* cited by examiner

DISPLAY PANEL AND ELECTRONIC DEVICE

CROSS-REFERENCE TO RELATED APPLICATION

This Application is a Section 371 National Stage Applicatin of International Application No. PCT/CN2020/090653, filed on May 15, 2020, which has not yet published, in Chinese, entitled "DISPLAY PANEL AND ELECTRONIC DEVICE", the content of which is hereby incorporated by reference in its entirety.

TECHNICAL FIELD

Embodiments of the present disclosure relate to the field of display technology, in particular, to a display panel and an electronic device.

BACKGROUND

Transparent display, as a novel display technology, allows observers to see the background behind a display screen. This novel display effect has broadened the application field of the display device and has received widespread attention.

SUMMARY

Some embodiments of the present disclosure provide a display panel, including: a base substrate; and a plurality of pixels arranged in an array on the base substrate, the plurality of pixels including a first pixel and a second pixel, wherein the first pixel includes a first light-transmitting area and a first display area that are sequentially arranged in a first direction, and the second pixel includes a second light-transmitting area and a second display area that are sequentially arranged in the first direction, the first pixel and the second pixel are adjacent in a second direction substantially perpendicular to the first direction, and the first light-transmitting area and the second light-transmitting area are adjacent in the second direction; wherein the display panel further includes: a first gate line and a second gate line both arranged between the first light-transmitting area and the second light-transmitting area that are adjacent in the second direction, and the first gate line and the second gate line both extend in the first direction, wherein the first light-transmitting area is contiguous to the first gate line, and the second light-transmitting area is contiguous to the second gate line.

In some embodiments, the display panel further includes: a wiring area arranged between the first light-transmitting area and the second light-transmitting area adjacent to each other, a length of the wiring area in the first direction, a length of the first light-transmitting area in the first direction and a length of the second light-transmitting area in the first direction are equal to each other, the wiring area is aligned with and is contiguous to the first light-transmitting area and the second light-transmitting area adjacent to each other, and the first gate line and the second gate line both pass through the wiring area in the first direction.

In some embodiments, the display panel includes a planarization layer and a pixel defining layer sequentially disposed on the base substrate, and an orthographic projection of the planarization layer on the base substrate and an orthographic projection of the pixel defining layer on the base substrate overlap none of an orthographic projection of the first light-transmitting area on the base substrate, an orthographic projection of the second light-transmitting area on the base substrate, and an orthographic projection of the wiring area on the base substrate.

In some embodiments, there is a gap between the first gate line and the second gate line, and the display panel further includes a light-shielding layer between the first light-transmitting area and the second light-transmitting area adjacent to each other, an orthographic projection of a part of the gap located in the wiring area on the base substrate falls within an orthographic projection of the light-shielding layer on the base substrate.

In some embodiments, the first gate line and the second gate line are arranged in the same layer, and the light-shielding layer is located a different layer from the first gate line and the second gate line.

In some embodiments, the light-shielding layer is located on a side of the first gate line and the second gate line facing the base substrate.

In some embodiments, a width of the wiring area in the second direction is greater than or equal to a width of the light-shielding layer in the second direction.

In some embodiments, a length of the light-shielding layer in the first direction is greater than or equal to a length of the wiring area in the first direction.

In some embodiments, the orthographic projection of the light-shielding layer on the base substrate does not overlap either of the orthographic projection of the first light-transmitting area on the base substrate and the orthographic projection of the second light-transmitting area on the base substrate.

In some embodiments, a material of the light-shielding layer contains an opaque metal material.

In some embodiments, the display panel further includes: a gate insulating layer disposed on a side of the first gate line and the second gate line facing the base substrate and on a side of the light-shielding layer away from the base substrate, wherein in the wiring area, the gate insulating layer includes a first part and a second part, an orthographic projection of the first part on the base substrate coincides with an orthographic projection of the first gate line on the base substrate, and an orthographic projection of the second part on the base substrate coincides with an orthographic projection of the second gate line on the base substrate.

In some embodiments, the display panel further includes a second power line extending in the second direction, wherein the second power line is configured to provide a constant voltage to the first pixel and the second pixel, and the light-shielding layer is electrically connected to the second power line through a via hole.

In some embodiments, the light-shielding layer is provided with an extension portion extending from an overlap of the light-shielding layer and the second power line in the second direction, and an orthographic projection of the via hole on the base substrate falls within an orthographic projection of the extension portion on the base substrate.

In some embodiments, the extension portion extends from the overlap of the light-shielding layer and the second power line toward the first pixel.

In some embodiments, the extension portion extends from the overlap of the light-shielding layer and the second power line toward the second pixel.

In some embodiments, the second power line provides a VSS voltage signal.

In some embodiments, the first pixel further includes a sub-pixel driving circuit located in the first display area, and the second pixel further includes a sub-pixel driving circuit located in the second display area. The first gate line is electrically connected to the sub-pixel driving circuit of the first pixel to provide a first control signal to the first pixel, and the second gate line is electrically connected to the sub-pixel driving circuit of the first pixel to provide a second control signal to the second pixel.

In some embodiments, the display panel is an OLED display panel.

Some embodiments of the present disclosure provide an electronic device including the display panel according to the above embodiments.

BRIEF DESCRIPTION OF THE DRAWINGS

By reading the detailed description of the non-limiting embodiments with reference to the following drawings, other features, objectives and advantages of the present disclosure will become more apparent.

DETAILED DESCRIPTION OF EMBODIMENTS

Figure 1:
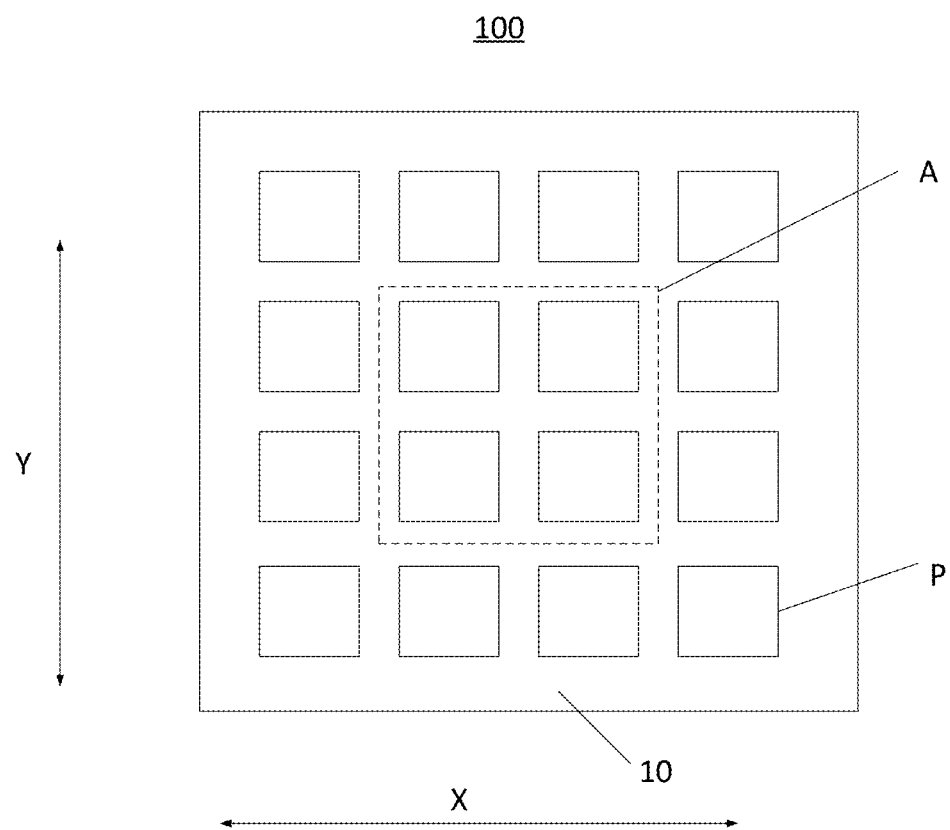
FIG. 1 is a schematic plan view of a transparent display panel according to some embodiments of the present disclosure.

The present disclosure will be further described in detail below with reference to drawings and embodiments. It may be understood that the specific embodiments described here are only used to explain the present disclose, but not to limit the present disclose. In addition, it should be noted that, for ease of description, only parts related to the present disclose are shown in the drawings.

It should be noted that the embodiments in the present disclosure and features in the embodiments may be combined with each other without conflict.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although terms such as first, second or the like may be used herein to describe different elements, these elements should not be limited by these terms. These terms are only used to distinguish one element from another element. For example, without departing from the scope of exemplary embodiments, the first element may be named as the second element, and similarly, the second element may be named as the first element. A term "and/or" as used herein includes any and all combinations of one or more of the related listed items.

It should be understood that when an element or layer is referred to as being "formed on" another element or layer, the element or layer may be directly or indirectly formed on another element or layer. That is, for example, there may be an intermediate element or layer. In contrast, when an element or layer is referred to as being "directly formed on" another element or layer, there is no intermediate element or layer. Other terms used to describe the relationship between elements or layers should be interpreted in a similar manner (for example, "between" and "directly between", "adjacent" and "directly adjacent", etc.).

Terms used herein are only for the purpose of describing specific embodiments, and are not intended to limit the embodiments. As used herein, unless the context clearly dictates otherwise, the singular form is also intended to include the plural form. It will also be understood that when the terms "comprise" and/or "include" are used herein, it means that the described features, wholes, steps, operations, elements and/or components are present, but it does not exclude the presence or addition of one or more other features, wholes, steps, operations, elements, components, and/or combinations thereof.

In this text, unless otherwise specified, expressions "located in the same layer" and "disposed in the same layer" generally mean that the first component and the second component may use the same material and may be formed by the same patterning process. Expressions "located in different layers" and "disposed in different layers" generally indicate that the first component and the second component are formed by different patterning processes.

In the following embodiments herein, a transparent display panel will be described by taking an OLED display panel as an example. Those skilled in the art may understand that the transparent display panel may also be other types of display panels, such as PLED display panel, quantum dot display panel.

Some embodiments of the present disclosure provide a display panel, specifically a transparent display panel. FIG. 1 shows a schematic plan view of a transparent display panel according to some embodiments of the present disclosure. As shown in FIG. 1, the transparent display panel 100 includes a base substrate 10 and a plurality of pixels P arranged in an array on the base substrate 10. The row direction of the pixel array is, for example, the first direction X, the column direction is, for example, the second direction Y, and the first direction X and the second direction Y are perpendicular to each other.

Figure 2:
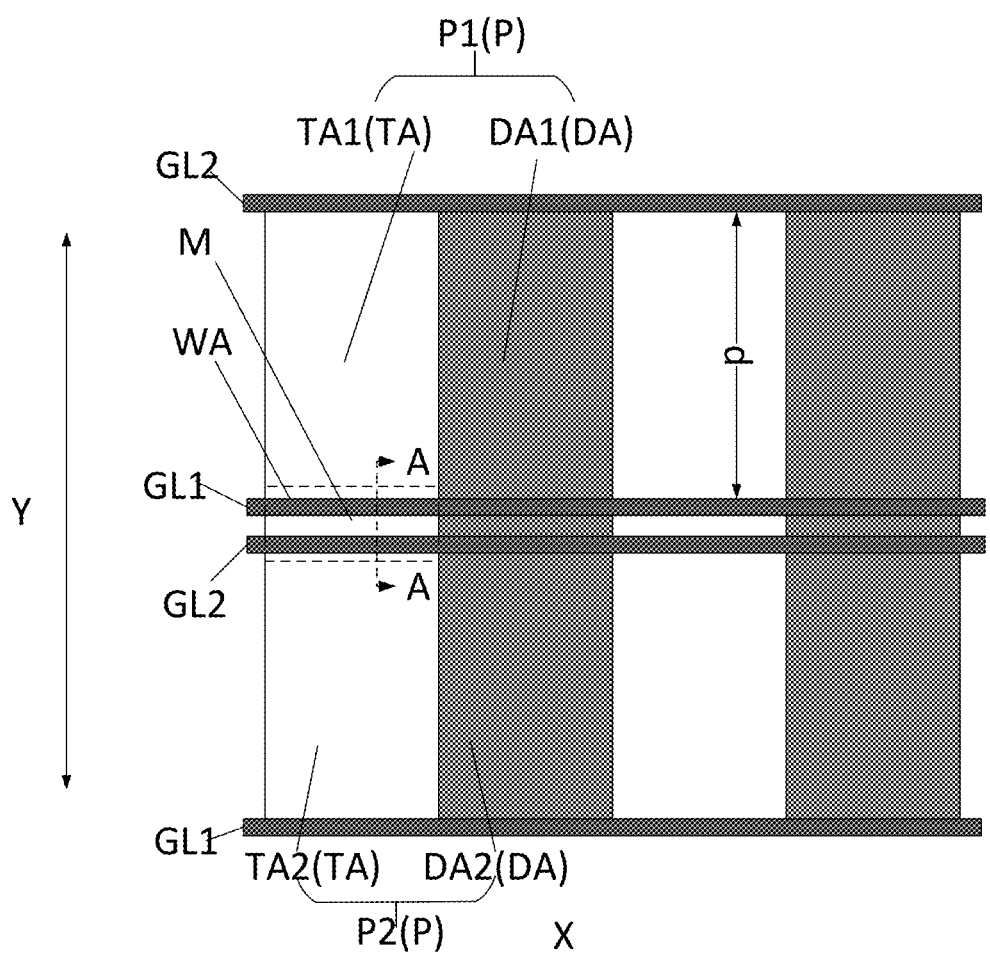
FIG. 2 is an enlarged schematic view of area A in FIG. 1.

FIG. 2 is an enlarged schematic view of an area A in FIG. 1, and only four pixels P are shown in FIG. 2. As shown in FIG. 2, each pixel P includes a light-transmitting area TA and a display area DA. The light-transmitting areas TA of the pixels P have the same shape and the same area. In each pixel P, the light-transmitting area TA and the display area DA are arranged side by side in the first direction. In the embodiments, as shown in FIG. 2, the light-transmitting area TA and the display area DA are arranged in left-right direction in each pixel P, and the light-transmitting area TA is located on the left side of the display area DA. Those skilled in the art may understand that, in other embodiments, the light-transmitting area TA may be located on the right side of the display area DA. In some embodiments, in parts of pixels, the light-transmitting area TA may be located on the left side of the display area DA; and in other pixels, the light-transmitting area TA may be located on the right side of the display area DA.

As shown in FIG. 2, a wiring area WA is provided between any two adjacent light-transmitting areas TA in the second direction Y. As a whole, multiple wiring areas WA are also arranged in an array on the base substrate 10. Taking the wiring area WA (enclosed by a dashed frame in FIG. 2) disposed between the first light-transmitting area TA1 of the first pixel P1 and the second light-transmitting area TA2 of the second pixel P2 as an example, the first pixel P1 includes a first light-transmitting area TA1 and a first display area DA1, the second pixel P2 includes a second light-transmitting area TA1 and a second display area DA2, and the wiring area WA is located between the first light-transmitting area TA1 and the second light-transmitting areas TA2 and is contiguous to both the first light-transmitting area TA1 and the second light-transmitting area TA2. That is, an edge of the wiring area WA away from the second light-transmitting area TA2 is in contact with an edge of the first light-transmitting area TA1 close to the second light-transmitting area TA2, and an edge of the wiring area WA away from the first light-transmitting area TA1 is in contact with an edge of the second light-transmitting area TA2 close to the first light-transmitting area TA1. The wiring area WA is aligned with both the first light-transmitting area TA1 and the second light-transmitting area TA2, that is, the wiring area WA is located between two columns of display areas that are adjacent to the first light-transmitting area TA1 and the second light-transmitting area TA2, wherein the two columns of display areas are respectively located on both sides of the first light-transmitting area TA1 and the second light-transmitting area TA2, and the width of the wiring area WA in the first direction is equal to each of the width of the first light-transmitting area TA1 in the first direction and the width of the second light-transmitting area TA2 in the first direction.

The transparent display panel 100 further includes a plurality of first gate lines GL1 and a plurality of second gate lines GL2, and one first gate line GL1 and one second gate line GL2 are provided between any two adjacent light-transmitting areas TA in the second direction Y. Taking the first gate line GL1 and the second gate line GL2 disposed between the first light-transmitting area TA1 and the second light-transmitting area TA2 as an example, the first gate line GL1 and the second gate line GL2 both extend in the first direction and pass through the wiring area WA, and they are basically arranged in parallel. There is a gap M between the first gate line GL1 and the second gate line GL2, and a width of the gap M is approximately 4 μm to 6 μm. As shown in FIG. 2, the gap M also extends in the first direction X. The first gate line GL1 is used to drive the pixel P where the first light-transmitting area TA1 is located, and the second gate line GL2 is used to drive the pixel P where the second light-transmitting area TA2 is located.

Each pixel P corresponds to one first gate line GL1 and one second gate line GL2. When a distance d between the first gate line G1 and the second gate line G2 corresponding to each pixel P in the second direction Y is a predetermined value, the length of the light-transmitting area TA in the second direction is determined by a position of a boundary between the light-transmitting area TA and an adjacent wiring area WA. The smaller the width of the wiring area WA in the second direction Y is, the greater the length of the light-transmitting area TA in the second direction Y is.

Figure 3:
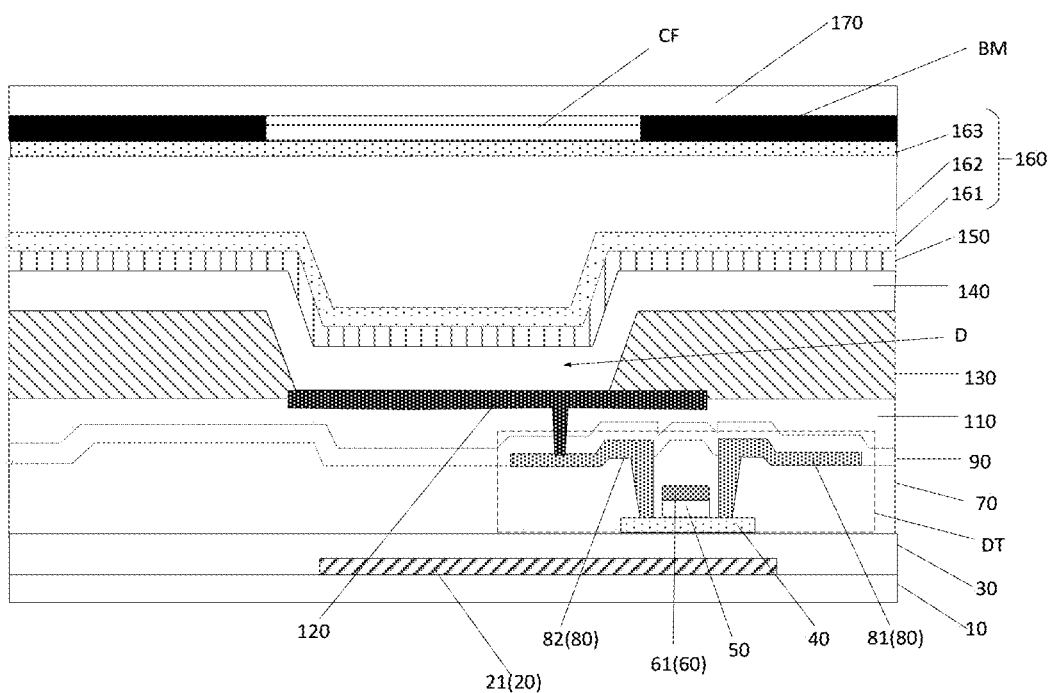
FIG. 3 is a schematic cross-sectional view of a display area of a pixel according to some embodiments of the present disclosure.

FIG. 3 shows a schematic cross-sectional view of the display area of the pixel according to some embodiments of the present disclosure. As shown in FIG. 3, in the display area DA of the pixel P, as shown in FIG. 3, a first metal layer 20, a first insulating layer 30, an active material layer 40, a second insulating layer 50, a second metal layer 60, a third insulating layer 70, a third metal layer 80, a fourth insulating layer 90, a fifth insulating layer 110, a first electrode layer 120, a pixel defining layer 130, a luminescent material layer 140, a second electrode layer 150, an encapsulation layer 160, a color filter layer CF, a black matrix layer BM and a packaging cover plate 170 are sequentially provided on the base substrate 10. In some embodiments, the fourth insulating layer 90 may be omitted.

The base substrate 10 and the packaging cover plate 170 are made of, for example, a glass material with good light transmission characteristic. The first insulating layer 30 is, for example, a buffer layer, and may also be referred to as the buffer layer 30 herein. The second insulating layer 50 is, for example, a gate insulating layer, and may also be referred to as the gate insulating layer 50 herein. The third insulating layer 70 is, for example, an interlayer dielectric layer, and may also be referred to as an interlayer dielectric layer 70 herein. The fourth insulating layer 90 is, for example, a passivation layer, and may also be referred to as the passivation layer 90 herein. The fifth insulating layer 110 is, for example, a planarization layer, and may also be referred to as the planarization layer 110 herein. The planarization layer 110 is formed of an organic material such as resin, and the pixel defining layer 130 is also formed of an organic material. In some embodiments, since the planarization layer 110 itself has an insulating effect, the passivation layer 90 may not be provided.

It is to be understood that FIG. 3 schematically shows a cross-sectional layer-structure of a single sub-pixel in the pixel display area, which is only used to indicate the layers in the display area, and does not reflect specific positions of the layers in the plan view.

As shown in FIG. 3, a single sub-pixel includes a driving transistor DT. The first metal layer 20 includes a shielding layer 21. The active material layer 40 includes an active layer 41 of the driving transistor DT. The shielding layer may be used to shield the active layer 41 of the driving transistor DT, to prevent external light from being incident on the active layer 41 of the driving transistor DT, thereby avoiding adverse effects on the display of the sub-pixels. For example, a projection of the active layer 41 of the driving transistor DT on the base substrate falls within a projection of the shielding layer 21 on the base substrate. For example, the single sub-pixel further includes a plurality of switching transistors, and projections of the active layers of the driving transistor and the switching transistors on the base substrate are all located within the projection of the shielding layer 21 on the base substrate, or the projections of the active layers of the driving transistors and the switching transistors on the base substrate overlap the projection of the shielding layer 21 on the base substrate. The second metal layer 60 includes a gate electrode 61 of the driving transistor DT, and the third metal layer 80 includes a first electrode 81 of the driving transistor DT, such as a drain electrode, and a second electrode 82, such as a source electrode. The first electrode layer 120 is, for example, an anode layer, which is also referred to as the anode layer 120 herein, and includes an anode of the light-emitting element D in the sub-pixel. The second electrode layer 150 is, for example, a cathode layer, which is also referred to as the cathode layer 150 herein, and includes a cathode of the light-emitting element D in the sub-pixel. The encapsulation layer 160 may include a first inorganic layer 161, an organic layer 162, and a second inorganic layer 163 stacked on one side thereof.

In some embodiments, the color filter layer CF and the black matrix BM may be pre-formed on the cover plate 170, and then the cover plate 170 on which the color filter layer CF and the black matrix BM have been provided is aligned and attached to the display substrate on which the encapsulation layer 160 has been formed on the base substrate 10 to form a transparent display panel 100. In some alternative embodiments, the color filter layer CF may be disposed on the display substrate including the base substrate 10, for example, directly disposed on the encapsulation layer 160 or located between the planarization layer 110 and the third metal layer 80. In some embodiments, the black matrix BM may also be replaced by color filter layers CF of different colors stacked onto each other.

In some embodiments, the luminescent material layer 140 is formed by evaporation on the entire surface, as shown in FIG. 3, for example, the light-emitting element D emits white light, and the color filter layer CF transmits different colors in the corresponding different sub-pixel regions, thereby achieving color display.

In some embodiments, the luminescent material layer 140 may be formed in an opening area of the pixel defining layer 130 by a printing process, and luminescent material layers 140 that emit light of different colors may be printed into the sub-pixels of different colors. In this case, the color filter layer CF may be omitted, even the cover plate 170 and the black matrix may be omitted.

In some embodiments, at least one of the first metal layer 20, the second metal layer 60, the third metal layer 80, the anode layer 120, the planarization layer 110, the pixel defining layer 130, the black matrix BM and the color filter layer CF that have no or poor light transmission effect is not arranged in the light-transmitting area TA, for example, none of the above-mentioned layers are arranged in the light-transmitting area TA to ensure the transparency effect of the light-transmitting area TA.

Figure 4:
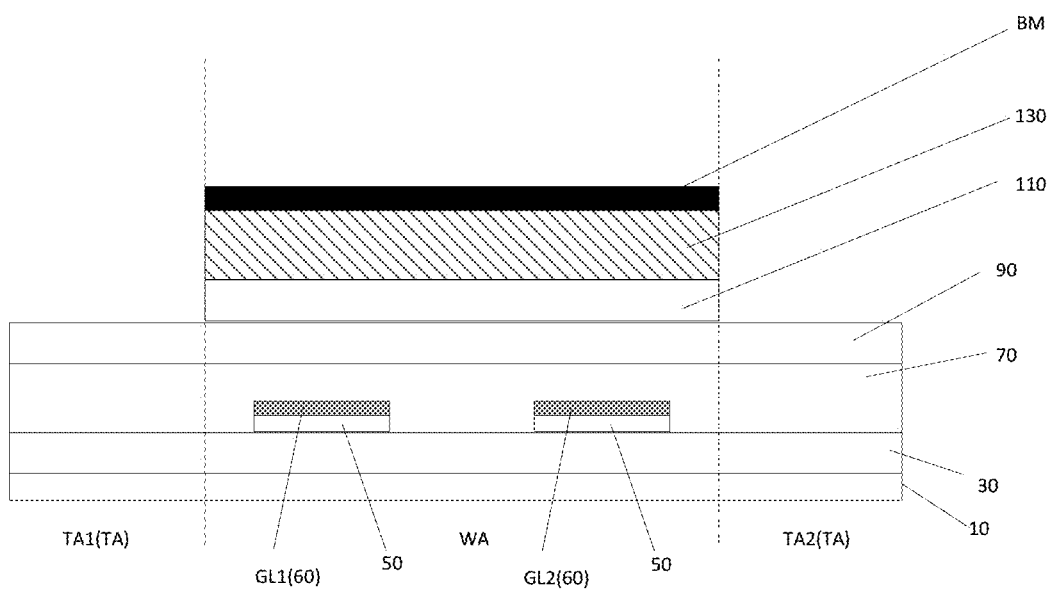
FIG. 4 is a schematic cross-sectional view along the line A-A in FIG. 2.

FIG. 4 is a schematic cross-sectional view along line A-A in FIG. 2. As shown in FIG. 4, in the light-transmitting area TA, a buffer layer 30, an interlayer dielectric layer 70, and a passivation layer 90 are sequentially stacked on the base substrate 10. In the wiring area WA, a buffer layer 30, a gate insulating layer 50, a second metal layer 60, an interlayer dielectric layer 70, a passivation layer 90, a planarization layer 110, a pixel defining layer 130, and a black matrix BM are sequentially stacked on the base substrate 10. The first gate line GL1 and the second gate line GL2 are located in the second metal layer 60. Those skilled in the art should understand that, the planarization layer 110, the pixel defining layer 130 and the black matrix BM are not shown in FIG. 2 in order to clearly show the relationship among the first gate line GL1, the second gate line GL2, the light-transmitting area TA and the wiring area WA. Those skilled in the art may understand that, in some embodiments, in the manufacturing process of the transparent display panel, the cathode layer 150 and the encapsulation layer 160 entirely cover the base substrate 10, that is, the cathode layer 150 and the encapsulation layer 160 disposed on the passivation layer 90 are also provided in the light-transmitting area TA; the cathode layer 150 and the encapsulation layer 160 disposed between the pixel defining layer 130 and the black matrix BM are also provided in the wiring area WA. In FIG. 4, in order to highlight a difference between the layer structure in the light-transmitting area TA and the layer structure in the wiring area WA, the cathode layer 150 and the encapsulation layer 160 are omitted.

As shown in FIG. 3 and FIG. 4, in some embodiments, the first metal layer 20, the second metal layer 60, the third metal layer 80, the anode layer 120, the planarization layer 110, the pixel defining layer 130, the black matrix BM, and the color filter layer CF that are opaque or have poor light transmission effects may not be provided in the light-transmitting area TA, to ensure the transparency of the light-transmitting area TA. The materials of the first metal layer 20, the second metal layer 60, and the third metal layer 80 may include gold (Au), silver (Ag), copper (Cu), aluminum (Al), molybdenum (Mo), magnesium (Mg), and tungsten (W), and an alloy material thereof. The anode layer 120 may be a reflective electrode, for example, may have a laminated structure of aluminum (Al), ITO, and aluminum (Al). The planarization layer 110 and the pixel defining layer 130 are organic material layers with a relatively large thickness, so that the light transmission performance is poor. Compared with the light-transmitting area TA, the wiring area WA further includes the gate insulating layer 50, the planarization layer 110, the pixel defining layer 130, and the black matrix BM in addition to the first gate line GL1 and the second gate line GL2.

The width of the wiring area WA is determined by widths of the planarization layer 110, the pixel defining layer 130, and the black matrix BM in the wiring area WA. The widths of the planarization layer 110, the pixel defining layer 130, and the black matrix BM in the wiring area WA also determine the boundary between the wiring area WA and the light-transmitting area TA. Generally, the planarization layer 110, the pixel defining layer 130 and the black matrix BM in the wiring area WA need to completely cover the first gate line GL1 and the second gate line GL2 in the wiring area WA, to prevent the first gate line GL1 and the second gate line GL2 reflecting light. Due to a large deviation in the process of forming the pixel defining layer 130, generally, an end of the pixel defining layer 130 in the wiring area WA close to the first light-transmitting area TA1 is closer to the first light-transmitting area TA1 than an end of the first gate line GL1 in the wiring area WA close to the first light-transmitting area TA1, and an end of the pixel defining layer 130 in the wiring area WA close to the second light-transmitting area TA2 is closer to the second light-transmitting area TA2 than an end of the second gate line GL2 in the wiring area WA close to the second light-transmitting area TA2. It may be considered that the width of the wiring area WA is determined by the width of the pixel defining layer 130 in the wiring area WA.

As shown in FIG. 4, the boundary between the wiring area WA and the first light-transmitting area TA1 is determined by a position of the end of the pixel defining layer 130 in the wiring area WA close to the first light-transmitting area TA1, and the boundary between the wiring area WA and the second light-transmitting area TA2 is determined by a position of the end of the pixel defining layer 130 in the wiring area WA close to the second light-transmitting area TA2. That is, an orthographic projection of the first light-transmitting area TA1 on the base substrate 10 is contiguous to an orthographic projection of the pixel defining layer 130 in the wiring area WA on the base substrate 10, and an orthographic projection the second light-transmitting area TA2 on the base substrate 10 is contiguous to the orthographic projection of the pixel defining layer 130 in the wiring area WA on the base substrate 10.

As shown in FIG. 4, in the wiring area WA, an orthographic projection of the gate insulating layer 60 on the base substrate 10 basically coincides with an orthographic projection of a combination of the first gate line GL1 and the second gate line GL2 on the base substrate 10. In other words, the gate insulating layer 60 includes a first part and a second part. An orthographic projection of the first part on the base substrate coincides with an orthographic projection of the first gate line GL1 on the base substrate 10, and an orthographic projection of the second part on the base substrate coincides with an orthographic projection of the second gate line GL2 on the base substrate 10. During the manufacturing process of the transparent display panel 100, the gate insulating layer 50 and the second electrode layer 60 including the first gate line GL1 and the second gate line GL2 may be formed by using the same mask, and have the same profile, thereby reducing the number of masks.

Figure 5:
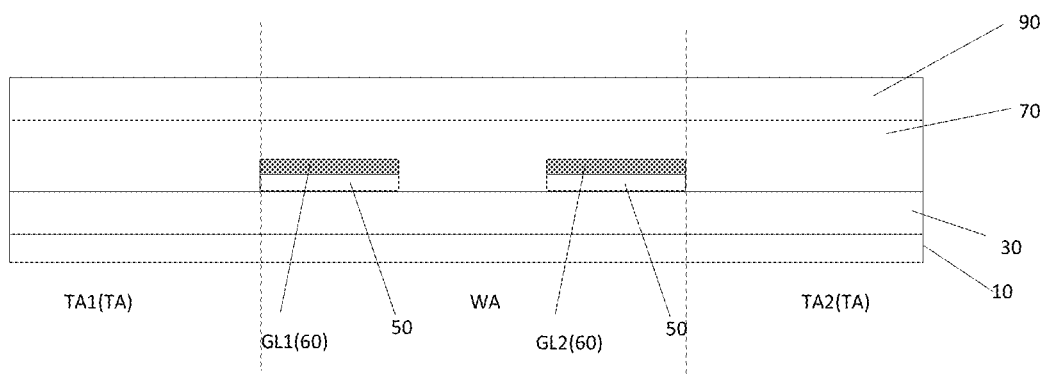
FIG. 5 is a schematic cross-sectional view along the line A-A in FIG. 2.

In order to increase the area of the light-transmitting area TA to make the transparent display panel 100 has a better light-transmitting effect, in some embodiments of the present disclosure, the planarization layer 110, the pixel defining layer 130 and black matrix BM are removed on the basis of the structure shown in FIG. 4. As shown in FIG. 5, the planarization layer 110, the pixel defining layer 130, and the black matrix BM are not provided in the wiring area WA, as a result, the width of the wiring area WA is reduced, thereby increasing the light-transmitting area TA. The boundary between the wiring area WA and the first light-transmitting area TA1 is determined by a position of the end of the first gate line GL1 in the wiring area WA close to the first light-transmitting area TA1, and the boundary between the wiring area WA and the second light-transmitting area TA2 is determined by a position of the end of the second gate line GL2 in the wiring area WA close to the second light-transmitting area TA2. That is, the orthographic projection of the first light-transmitting area TA1 on the base substrate 10 is contiguous to the orthographic projection of the first gate line GL1 in the wiring area WA on the base substrate 10, and the orthographic projection of the second light-transmitting area TA2 on the base substrate 10 is contiguous to the orthographic projection of the second gate line GL2 in the wiring area WA on the base substrate 10. In some embodiments, the width of the wiring area WA in the second direction Y is about 1/10 of the length of the first light-transmitting area TA1 in the second direction Y.

In some embodiments, in the case that the planarization layer 110, the pixel defining layer 130, and the black matrix BM are not provided in the wiring area WA, an anti-reflective film may be attached to the light-emitting surface of the transparent display panel 100 in order to avoid light reflection caused by the first gate line GL1 and the second gate line GL2 in the wiring area WA.

The Applicant has found that in the structure shown in FIG. 5, since there is a gap M between the first gate line GL1 and the second gate line GL2, and the planarization layer 110, the pixel defining layer 130 and the black matrix BM has been removed in the wiring area WA, it is possible that the gap M between the first gate line GL1 and the second gate line GL2 may cause slit diffraction, which may affect the display effect.

It should be noted that, in the above exemplary structure, the black matrix BM is not a necessary structure, and may be set according to actual shading requirements. In some embodiments, the above-mentioned display panel 100 may not include the black matrix BM.

Figure 6:
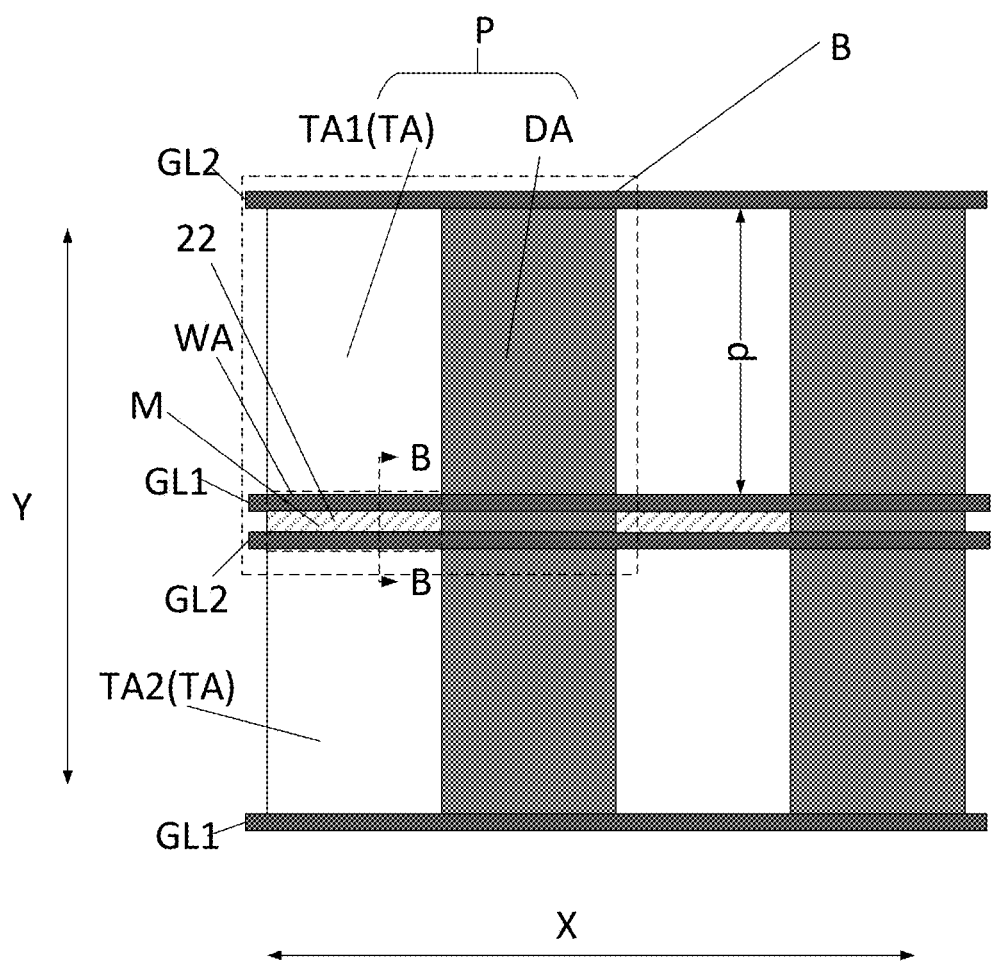
FIG. 6 is a schematic partial plan view of a transparent display panel according to some embodiments of the present disclosure.

Based on this, on the basis of the structure shown in FIG. 5, in some embodiments of the present disclosure, a light-shielding layer is provided to shield the gap M between the first gate line GL1 and the second gate line GL2. FIG. 6 is a schematic partial plan view of a transparent display panel according to some embodiments of the present disclosure, and FIG. 7 is a schematic cross-sectional view along the line B-B in FIG. 6.

Figure 7:
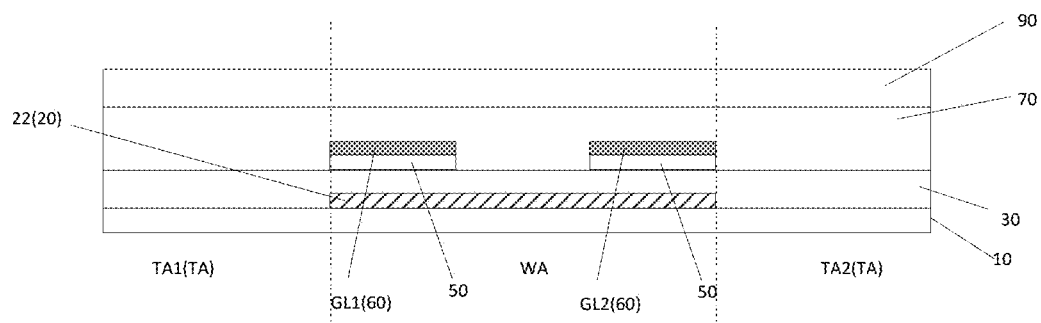
FIG. 7 is a schematic cross-sectional view along line B-B in FIG. 6.

As shown in FIGS. 6 and 7, compared to the structure shown in FIG. 5, the display panel 100 in this embodiment is additionally provided with a light-shielding layer 22 for shielding the gap M between the first gate line GL1 and the second gate line GL2 in the wiring area WA. The light-shielding layer 22 is located on a side of the first gate line GL1 and the second gate line GL2 facing the base substrate 10. The light-shielding layer 22 may be formed in the first metal layer 20, that is, it is provided in the same layer as the shielding layer 21 in the display area DA. In other embodiments, the light-shielding layer may also be formed in other layers, as long as the light-shielding layer 22 may be used to shield the gap M between the first gate line GL1 and the second gate line GL2 in the wiring area WA. For example, the light-shielding layer may be formed by using the third metal layer 80. In this case, the light-shielding layer is provided in the same layer as the source electrode and the drain electrode of the transistor. For example, the light-shielding layer is formed by using the first electrode layer 120, in this case, the light-shielding layer and the anode of the light-emitting element are provided in the same layer. In some embodiments, the light-shielding layer may be made of metallic materials or non-metallic materials, as long as the light-shielding layer is made of light-shielding materials.

As shown in FIGS. 6 and 7, the light-shielding layer 22 extends in the first direction X, and a length thereof in the first direction X is greater than or equal to the length of the wiring area WA in the first direction X, and a width thereof in the second direction Y is smaller than the width of the wiring area WA in the second direction Y. In the embodiments, the length of the light-shielding layer 22 in the first direction X is slightly larger than the length of the wiring area WA in the first direction X, and the width of the light-shielding layer 22 in the second direction Y is equal to the width of the wiring area WA in the second direction Y. As shown in FIG. 6, in the embodiments, the light-shielding layer 22 corresponding to adjacent pixels P in the same row is disconnected. In other embodiments, the light-shielding layer 22 may also extend continuously through multiple pixel columns in the first direction.

As shown in FIGS. 6 and 7, an orthographic projection of the light-shielding layer 22 on the base substrate 10 does not overlap an orthographic projection of each of the first light-transmitting area TA1 and the second light-transmitting area TA2 on the base substrate. For example, the orthographic projection of the light-shielding layer 22 on the base substrate 22 adjoins the orthographic projection of each of the first light-transmitting area TA1 and the second light-transmitting area TA2 on the base substrate. For example, the end of the light-shielding layer 22 close to the first light-transmitting area TA1 is farther away from the first light-transmitting area TA1 than the end of the first gate line GL1 in the wiring area WA close to the first light-transmitting area TA1, and the end of the light-shielding layer 22 close to the second light-transmitting area TA2 is farther away from the second light-transmitting area TA2 than the end of the second gate line GL2 in the wiring area WA close to the second light-transmitting area TA2.

The width of the light-shielding layer 22 in the second direction Y is not specifically limited, as long as it is able to shield the gap M between the first gate line GL1 and the second gate line GL2 in the wiring area WA. That is, as long as an orthographic projection of a portion of the gap M in the wiring area WA on the base substrate 10 falls within the orthographic projection of the light-shielding layer 22 on the base substrate.

Figure 8:
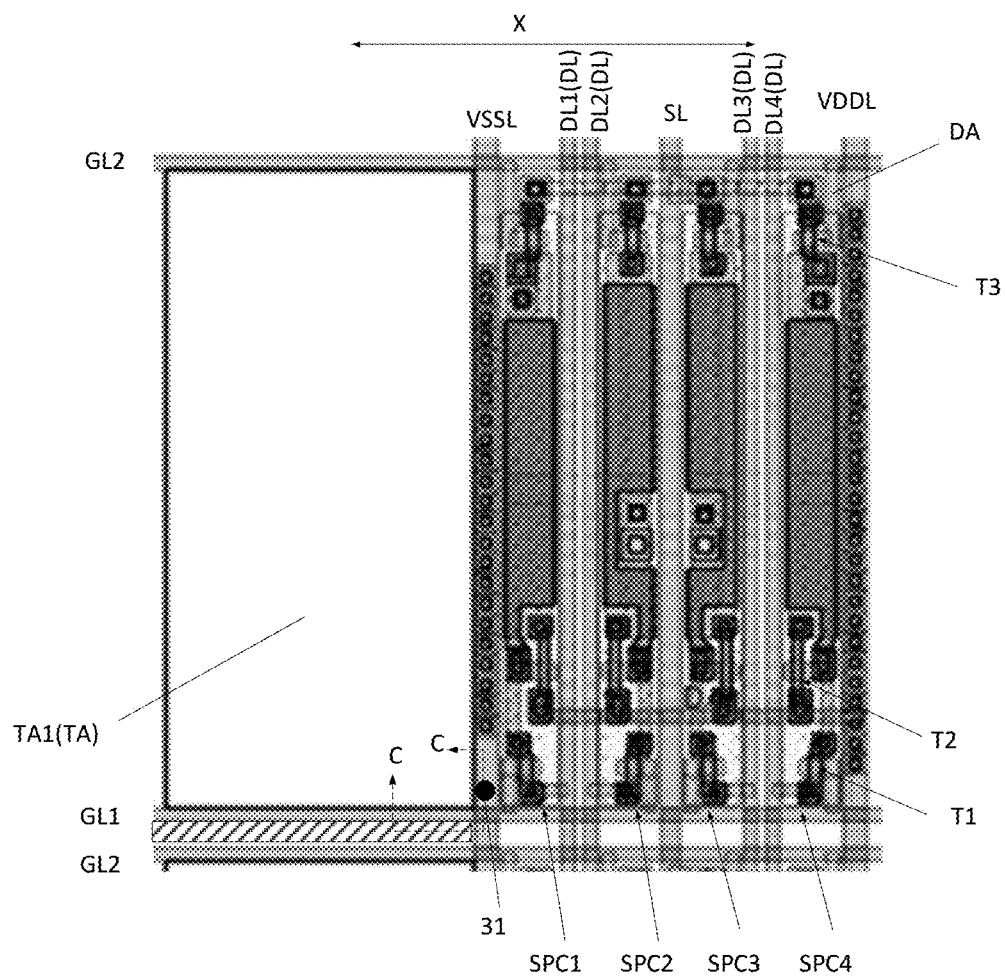
FIG. 8 is an enlarged schematic view of area B in FIG. 6.

In some embodiments, FIG. 8 is an enlarged schematic view of the area B in FIG. 6, and FIG. 8 mainly shows a specific structure of a pixel P. As shown in FIG. 8, the transparent display panel 100 further includes a second power line VSSL, the second power line VSSL extends in the second direction Y and is configured to provide a constant voltage, such as a VSS voltage, to the pixel P. Specifically, the second power line VSSL is located in the third metal layer 80 and is configured to be electrically connected to the cathode of the light-emitting element D of the pixel P. As shown in FIG. 8, taking a pixel P where the first light-transmitting area TA1 is located as an example, the second power line VSSL is located at the edge of the display area DA of the pixel P close to the first light-transmitting area TA1.

Figure 9:
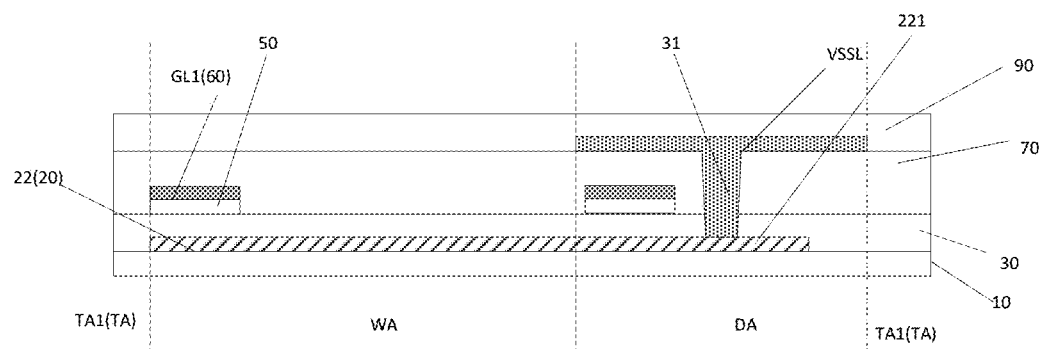
FIG. 9 is a schematic cross-sectional view along line C-C in FIG. 8.

FIG. 9 is a schematic cross-sectional view along the line C-C in FIG. 8. As shown in FIGS. 8 and 9, in order to prevent the light-shielding layer 22 from being in a floating state (the floating state of the light-shielding layer 22 may cause crosstalk to signals on the first gate line GL1 and the second gate line GL2), the light-shielding layer 22 may be electrically connected to the second power line VSSL, and supplied with the constant VSS voltage. Specifically, the light-shielding layer 22 extends in the first direction X and has an overlap with the second power line VSSL. The light-shielding layer 22 is provided with an extension portion 221 which extends from the overlap in the second direction, and the extension portion 221 is electrically connected to the second power line VSSL through a via hole 31. An orthographic projection of the via hole 31 on the base substrate 10 falls within an orthographic projection of the extension portion 221 on the base substrate 10.

Although FIG. 8 and FIG. 9 show that the extension portion 221 extends from the overlap of the light-shielding layer 22 and the second power line VSSL toward the pixel where the first light-transmitting area TA1 is located, those skilled in the art may understand that in other embodiments, the extension portion 221 may also extend from the overlap of the light-shielding layer 22 and the second power line VSSL toward the pixel where the second light-transmitting area TA2 is located.

Those skilled in the art may understand that the extension portion 221 is not necessary. In some embodiments, the extension portion may not be provided, and the light-shielding layer 22 is in a floating state.

FIG. 8 shows a schematic plan view of a display area of a single pixel according to some embodiments of the present disclosure. As shown in FIG. 8, the display area DA of the pixel P includes four sub-pixels, namely, a first sub-pixel, a second sub-pixel, a third sub-pixel and a fourth sub-pixel. The four sub-pixels may be a red sub-pixel, a green sub-pixel, a blue sub-pixel, and a white sub-pixel, respectively. Those skilled in the art may understand that each sub-pixel includes a sub-pixel driving circuit and a light-emitting element D located on the sub-pixel driving circuit, and the light-emitting elements of the four sub-pixels may be adjusted in shape and arrangement according to actual needs, as long as it is ensured that the sub-pixel driving circuit of each sub-pixel may drive its corresponding light-emitting element D. In the art, the pixel defining layer is used to define a position and a shape of a light-emitting area of the light-emitting element. The luminescent material layer of the light-emitting element is arranged in the opening of the pixel defining layer. The position and the shape of the opening of the pixel defining layer is adjustable according to actual needs to adjust the position and the shape of the luminescent material layer of the organic light-emitting element.

In order to clearly show a structure and a positional relationship of respective sub-pixels, FIG. 8 does not show the light-emitting element of each sub-pixel and the pixel defining layer surrounding each light-emitting element. It mainly shows the sub-pixel driving circuits of the first sub-pixel, the second sub-pixel, the third sub-pixel, and the fourth sub-pixel, namely a first sub-pixel driving circuit SPC1, a second sub-pixel driving circuit SPC2, a third sub-pixel driving circuit SPC3 and a fourth sub-pixel driving circuit SPC4. As shown in FIG. 8, the first sub-pixel driving circuit SPC1, the second sub-pixel driving circuit SPC2, the third sub-pixel driving circuit SPC3, and the fourth sub-pixel driving circuit SPC4 all extend in the second direction Y, and are sequentially arranged side by side in the first direction X in the pixel P. The first sub-pixel driving circuit SPC1, the second sub-pixel driving circuit SPC2, the third sub-pixel driving circuit SPC3, and the fourth sub-pixel driving circuit SPC4 constitute the pixel driving circuit of the pixel P. Therefore, FIG. 8 may also be used as a schematic structural view of a pixel driving circuit of a single pixel according to some embodiments of the present disclosure. In the embodiments, the first sub-pixel driving circuit SPC1, the second sub-pixel driving circuit SPC2, the third sub-pixel driving circuit SPC3, and the fourth sub-pixel driving circuit SPC4 are arranged away from the light-transmitting area TA of the pixel P in sequence.

In the embodiments, a pixel structure having four sub-pixels is taken as an example. Those skilled in the art may understand that in other embodiments, a single pixel may have other numbers of sub-pixels, such as three, namely, a red sub-pixel, a green sub-pixel and a blue sub-pixel.

Figure 10:
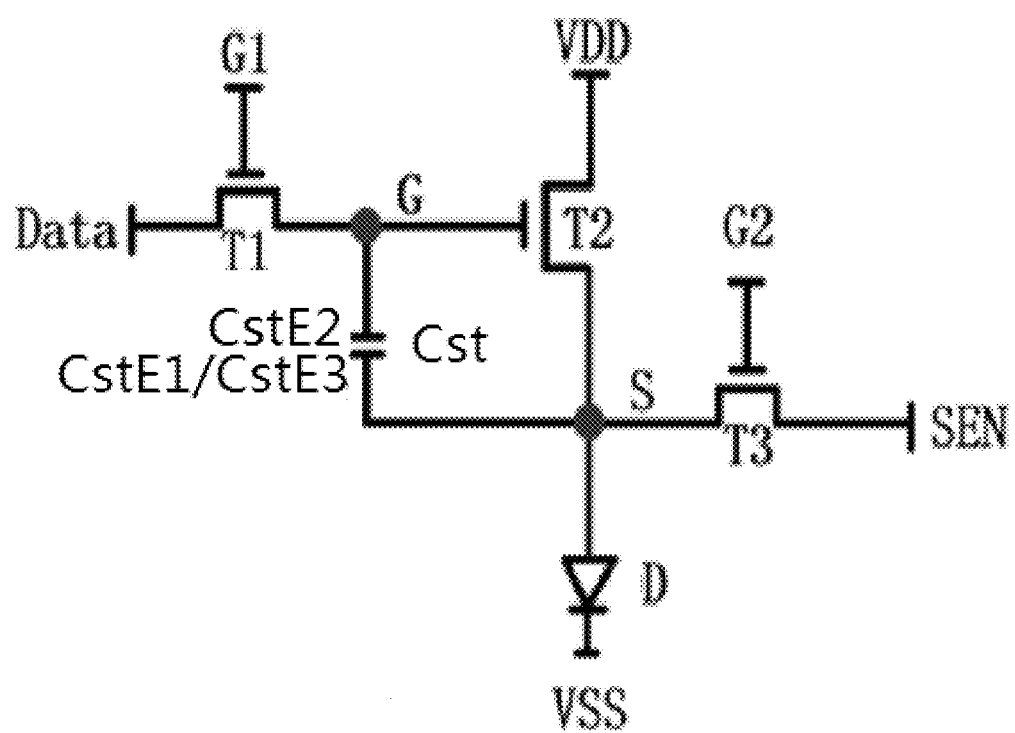
FIG. 10 is a circuit diagram of a single sub-pixel according to some embodiments of the present disclosure.

FIG. 10 is a circuit diagram of a single sub-pixel according to some embodiments of the present disclosure. The single pixel P in the embodiments of the present disclosure will be explained below with reference to FIG. 8 and FIG. 10.

As shown in FIG. 8, each pixel P corresponds to one first gate line GL1, one second gate line GL2, one first power line VDDL, one second power line VSSL, one detection line SL, and four data lines DL. As shown in FIG. 10, each of the first sub-pixel driving circuit SPC1, the second sub-pixel driving circuit SPC2, the third sub-pixel driving circuit SPC3, and the fourth sub-pixel driving circuit SPC4 includes a first transistor T1 (also referred to as a switching transistor T1), a second transistor T2 (also referred to as a driving transistor T2), a third transistor T3 (also referred to as a detection transistor T3), and a storage capacitor Cst. The first gate line GL1 provides a first control signal G1 for each sub-pixel driving circuit. The second gate line GL2 provides a second control signal G2 for each sub-pixel driving circuit. The first data line DL1, the second data line DL2, and the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. The first power line VDDL provides a constant first voltage signal, such as a VDD voltage signal, for each sub-pixel driving circuit, and the second power line VSSL provides a constant second voltage signal, such as a VSS voltage signal, for each sub-pixel driving circuit. The detection line SL is used to provide a reset signal for each sub-pixel driving circuit, and is used to sample and detect electrical characteristics of each sub-pixel driving circuit, such as the threshold voltage of the second transistor T2, to achieve external compensation and obtain a better display effect.

Specifically, each sub-pixel driving circuit includes a switching transistor T1, a driving transistor T2, a detection transistor T3, and a storage capacitor Cst. The driving transistor T2 is the driving transistor DT in FIG. 3. A gate electrode of the switching transistor T1 receives the first control signal G1 provided by the first gate line GL1. A first electrode of the switching transistor T1, for example, a drain electrode, receives the data signal Data provided by the data line DL. A second electrode of the switching transistor T1, for example, a source electrode, is electrically connected to a second capacitor electrode CstE2 of the storage capacitor Cst and a gate electrode of the driving transistor T2, and the second electrode of the switching transistor T1, second capacitor electrode CstE2 and the gate electrode of the driving transistor T2 are electrically connected at a first node G. The switching transistor T1 is configured to write the data signal Data to the gate electrode of the driving transistor T2 and the storage capacitor Cst in response to the first control signal G1.

A first electrode of the driving transistor T2, for example, a drain electrode, is electrically connected to the first power line VDDL through a first power connection line VDDLS, and receives the first voltage signal provided by the first power line VDDL, such as the VDD voltage signal. A second electrode of the transistor T2, for example, a source electrode, is electrically connected to a first capacitor electrode CstE1 of the storage capacitor Cst, and is configured to be electrically connected to the anode of the light-emitting element D. The driving transistor T2 is configured to control the current for driving the light-emitting element D under the control of the voltage of the gate electrode of the driving transistor T2.

A gate electrode of the detection transistor T3 receives the second control signal G2 provided by the second gate line GL2. A first electrode of the detection transistor T3, for example, a source electrode, is electrically connected with the second electrode of the driving transistor T2 and the second capacitor electrode CstE2 of the storage capacitor Cst, and the first electrode of the detection transistor T3, the second electrode of the driving transistor T2 and the second capacitor electrode CstE2 are electrically connected at a second node S. A second electrode of the detection transistor T3, for example, a drain electrode, is electrically connected to the detection line SL through a detection connection line SLS, and it obtains the reset signal from the detection line SL and provides a sampling detection signal SEN to the detection line SL. The detection transistor T3 is configured to detect the electrical characteristics of the sub-pixel driving circuit including the detection transistor in response to the second control signal G2 to achieve external compensation. The electrical characteristics include, for example, the threshold voltage and/or carrier mobility of the switching transistor T1, or the threshold voltage and drive current of the light-emitting element.

The anode of the light-emitting element D is electrically connected to the second electrode of the driving transistor T2, for example, the source electrode, and the cathode of the light-emitting element D is electrically connected to the second power line VSSL, for example, through a through hole, to receive a VSS voltage signal. The light-emitting element D realizes light emission based on the current flowing through it, and the luminous intensity is determined by the intensity of the current flowing through the light-emitting element D.

In some embodiments, the storage capacitor Cst may include a third capacitor electrode CstE3 electrically connected to the first capacitor electrode CstE1. The first capacitor electrode CstE1, the second capacitor electrode CstE2, and the third capacitor electrode CstE2 are sequentially stacked on the base substrate 10. The first capacitor electrode CstE1 and the second capacitor electrode CstE2 have an overlapping area, and the first capacitor electrode CstE1 and the second capacitor electrode CstE2 constitute a first capacitor. The third capacitor electrode CstE3 and the second capacitor electrode CstE2 have an overlapping area, and the third capacitor electrode CstE3 and the second capacitor electrode CstE2 constitute a second capacitor. The storage capacitor Cst may include the first capacitor and the second capacitor that are connected in parallel, thereby increasing the capacitance of the storage capacitor Cst.

The transistors used in the embodiments of the present disclosure may all be thin film transistors or field effect transistors or other switching devices with the same characteristics. In the embodiments of the present disclosure, thin film transistors are taken as examples for description. The source electrode and the drain electrode of the transistor used here may be symmetrical in structure, so there may be no difference in structure between the electrode and the drain electrode thereof. In the embodiments of the present disclosure, in order to distinguish the two electrodes of the transistor except the gate electrode, one electrode is directly described as a first electrode and the other electrode is described as a second electrode. In addition, transistors may be divided into N-type and P-type transistors according to their characteristics. When the transistor is a P-type transistor, the turn-on voltage is a low-level voltage (for example, 0V, −5V, −10V or other suitable voltages), and the turn-off voltage is a high-level voltage (for example, 5V, 10V or other suitable voltages); when the transistor is an N-type transistor, the turn-on voltage is a high-level voltage (for example, 5V, 10V or other suitable voltage), and the turn-off voltage is a low-level voltage (for example, 0V, −5V, −10V or other suitable voltage). It should be noted that in the description herein, an N-type transistor is taken as an example of the transistor for description, but it is not a limitation of the present disclosure.

In the following embodiments, taking the pixel structure shown in FIG. 8 as an example, a single pixel structure and a pixel driving circuit of a single pixel in a transparent display panel will be described in detail.

Figure 11:
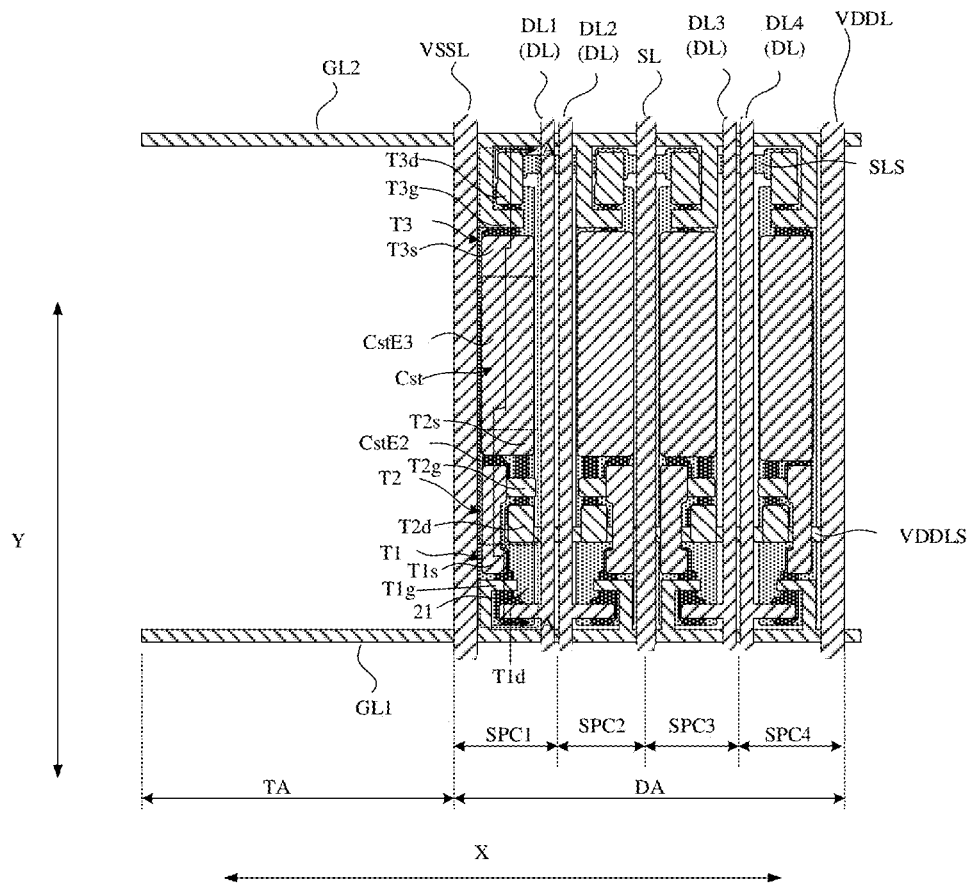
FIG. 11 is a schematic plan view of a single pixel of a transparent display panel according to some embodiments of the present disclosure.

FIG. 11 shows a schematic plan view of a display area of a single pixel according to some embodiments of the present disclosure. FIG. 11 may be regarded as a more detailed schematic structural view of the pixel structure in FIG. 8. As shown in FIG. 11, the display area DA of the pixel P includes four sub-pixels, namely, the first sub-pixel, the second sub-pixel, the third sub-pixel and the fourth sub-pixel. The four sub-pixels may be a red sub-pixel, a green sub-pixel, a blue sub-pixel, and a white sub-pixel, respectively. Those skilled in the art may understand that each sub-pixel includes a sub-pixel driving circuit and a light-emitting element D located on the sub-pixel driving circuit, and the light-emitting elements of the four sub-pixels may be adjusted in shape and arrangement according to actual needs, as long as it is ensured that the sub-pixel driving circuit of each sub-pixel may drive its corresponding light-emitting element D. In the art, the pixel defining layer is used to define the position and the shape of the light-emitting area of the light-emitting element. The luminescent material layer of the light-emitting element is arranged in the opening of the pixel defining layer. The position and the shape of the opening of the pixel defining layer is adjustable according to actual needs to adjust the position and the shape of the luminescent material layer of the organic light-emitting element.

In order to clearly show the structure and the positional relationship of respective sub-pixels, FIG. 11 does not show the light-emitting element of each sub-pixel and the pixel defining layer surrounding each light-emitting element. It mainly shows the sub-pixel driving circuits of the first sub-pixel, the second sub-pixel, the third sub-pixel, and the fourth sub-pixel, namely a first sub-pixel driving circuit SPC1, a second sub-pixel driving circuit SPC2, a third sub-pixel driving circuit SPC3 and a fourth sub-pixel driving circuit SPC4. As shown in FIG. 11, the first sub-pixel driving circuit SPC1, the second sub-pixel driving circuit SPC2, the third sub-pixel driving circuit SPC3, and the fourth sub-pixel driving circuit SPC4 all extend in the second direction Y, and are sequentially arranged side by side in the first direction X in the pixel P. The first sub-pixel driving circuit SPC1, the second sub-pixel driving circuit SPC2, the third sub-pixel driving circuit SPC3, and the fourth sub-pixel driving circuit SPC4 constitutes the pixel driving circuit of the pixel P. Therefore, FIG. 11 may also be regard as a schematic structural view of a pixel driving circuit of a single pixel according to some embodiments of the present disclosure. In the embodiments, the first sub-pixel driving circuit SPC1, the second sub-pixel driving circuit SPC2, the third sub-pixel driving circuit SPC3, and the fourth sub-pixel driving circuit SPC4 are arranged away from the light-transmitting area TA of the pixel P in sequence.

In the embodiments, a pixel structure provided with four sub-pixels is taken as an example. Those skilled in the art may understand that in other embodiments, a single pixel may have other numbers of sub-pixels, for example, three, namely, a red sub-pixel, a green sub-pixel and a blue sub-pixel.

FIG. 10 is a circuit diagram of a single sub-pixel according to an embodiment of the present disclosure. The single pixel P in the embodiments of the present disclosure will be explained below with reference to FIG. 11 and FIG. 10.

As shown in FIG. 11, each pixel P corresponds to one first gate line GL1, one second gate line GL2, one first power line VDDL, one second power line VSSL, one detection line SL, and four data lines DL. As shown in FIG. 10, each of the first sub-pixel driving circuit SPC1, the second sub-pixel driving circuit SPC2, the third sub-pixel driving circuit SPC3, and the fourth sub-pixel driving circuit SPC4 includes a first transistor T1 (also referred to as a switching transistor T1), a second transistor T2 (also referred to as a driving transistor T2), a third transistor T3 (also referred to as a detection transistor T3), and a storage capacitor Cst. The first gate line GL1 provides a first control signal G1 for each sub-pixel driving circuit. The second gate line GL2 provides a second control signal G2 for each sub-pixel driving circuit. The first data line DL1, the second data line DL2, the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. The first power line VDDL provides a constant first voltage signal, such as a VDD voltage signal, for each sub-pixel driving circuit, and the second power line VSSL provides a constant second voltage signal, such as a VSS voltage signal, for each sub-pixel driving circuit. The detection line SL is used to provide a reset signal to each sub-pixel driving circuit, and is used to sample and detect the electrical characteristics of each sub-pixel driving circuit, such as the threshold voltage of the second transistor T2, to achieve external compensation and obtain a better display effect.

Specifically, each sub-pixel driving circuit includes a switching transistor T1, a driving transistor T2, a detection transistor T3, and a storage capacitor Cst. The driving transistor T2 is the driving transistor DT in FIG. 3. A gate electrode of the switching transistor T1 receives the first control signal G1 provided by the first gate line GL1. A first electrode of the switching transistor T1, for example, a drain electrode, receives the data signal Data provided by the data line DL. A second electrode of the switching transistor T1, for example, a source electrode, is electrically connected to a second capacitor electrode CstE2 of the storage capacitor Cst and a gate electrode of the driving transistor T2, and the second electrode of the switching transistor T1, the second capacitor electrode CstE2 and the gate electrode of the driving transistor T2 are electrically connected at a first node G. The switching transistor T1 is configured to write the data signal Data to the gate electrode of the driving transistor T2 and the storage capacitor Cst in response to the first control signal G1.

A first electrode of the driving transistor T2, for example, a drain electrode, is electrically connected to the first power line VDDL through a first power connection line VDDLS, and receives the first voltage signal provided by the first power line VDDL, such as the VDD voltage signal. A second electrode of the driving transistor T2, for example, a source electrode, is electrically connected to a second capacitor electrode CstE2 of the storage capacitor Cst, and is configured to be electrically connected to the anode of the light-emitting element D. The driving transistor T2 is configured to control the current for driving the light-emitting element D under the control of the voltage of the gate electrode of the driving transistor T2.

A gate electrode of the detection transistor T3 receives the second control signal G2 provided by the second gate line GL2. A first electrode of the detection transistor T3, for example, a source electrode, is electrically connected to the second electrode of the driving transistor T2 and the second capacitor electrode CstE2 of the storage capacitor Cst, and the first electrode of the detection transistor T3, the second electrode of the driving transistor T2 and the second capacitor electrode CstE2 are electrically connected at a second node S. A second electrode of the detection transistor T3, for example, a drain electrode, is electrically connected to the detection line SL through the detection connection line SLS, it obtains the reset signal from the detection line SL and provides a sampling detection signal SEN to the detection line SL. The detection transistor T3 is configured to detect the electrical characteristics of the sub-pixel driving circuit including the detection transistor in response to the second control signal G2 to achieve external compensation. The electrical characteristics include, for example, the threshold voltage and/or carrier mobility of the switching transistor T1, or the threshold voltage and drive current of the light-emitting element.

The anode of the light-emitting element D is electrically connected to the second electrode of the driving transistor T2, for example, the source electrode, and the cathode of the light-emitting element D is electrically connected to the second power line VSSL, for example, through a through hole, to receive a VSS voltage signal. The light-emitting element D realizes light emission based on the current flowing through it, and the luminous intensity is determined by the intensity of the current flowing through the light-emitting element D.

In some embodiments, the storage capacitor Cst may include a third capacitor electrode CstE3 electrically connected to the first capacitor electrode CstE1. The first capacitor electrode CstE1, the second capacitor electrode CstE2, and the third capacitor electrode CstE3 are sequentially stacked on the base substrate 10. The first capacitor electrode CstE1 and the second capacitor electrode CstE2 have an overlapping area, and the first capacitor electrode CstE1 and the second capacitor electrode CstE2 constitute a first capacitor. The third capacitor electrode CstE3 and the second capacitor electrode CstE2 have an overlapping area, and the third capacitor electrode CstE3 and the second capacitor electrode CstE2 constitute a second capacitor. The storage capacitor Cst may include the first capacitor and the second capacitor that are connected in parallel, thereby increasing the capacitance of the storage capacitor Cst.

As shown in FIG. 11, in the region corresponding to the single pixel P, that is, between both ends of the single pixel in the first direction X, both the first gate line GL1 and the second gate line GL2 extend in the first direction X, for example in a linear shape, the first gate line GL1 and the second gate line GL2 are respectively disposed on both sides of the light-transmitting area TA, that is, the light-transmitting area TA is sandwiched between the first gate line GL1 and the second gate line GL2. In other embodiments, the first gate line GL1 and the second gate line GL2 may also pass through the light-transmitting area TA. In the region corresponding to the single pixel P, that is, in the range shown in FIG. 11, the first power line VDDL, the second power line VSSL, the detection line SL and the four data lines DL all extend in the second direction Y, for example, in a linear shape. Specifically, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2. The first data line DL1 is closer to the first sub-pixel driving circuit SPC1 than the second data line DL2, and the second data line DL2 is closer to the second sub-pixel driving circuit SPC2 than the first data line DL1, that is, the first data line DL1 is located between the first sub-pixel driving circuit SPC1 and the second data line DL2, and the second data line DL2 is located between the first data line DL1 and the second sub-pixel driving circuit SPC2. The third data line DL3 and the fourth data line DL4 are arranged between the third sub-pixel driving circuit SPC3 and the fourth sub-pixel driving circuit SPC4. The third data line DL3 is closer to the third sub-pixel driving circuit SPC3 than the fourth data line DL4, and the fourth data line DL4 is closer to the fourth sub-pixel driving circuit SPC4 than the third data line DL3, that is, the third data line DL3 is located between the third sub-pixel driving circuit SPC3 and the fourth data line DL4, and the fourth data line DL4 is located between the third data line DL3 and the fourth sub-pixel driving circuit SPC4. The second power line VSSL is located on the side of the first sub-pixel driving circuit SPC1 away from the first data line DL1, that is, between the light-transmitting area TA and the first sub-pixel driving circuit SPC1. The first power line VDDL is located on the side of the fourth sub-pixel driving circuit SPC4 away from the fourth data line DL4. In the embodiments, the structure of the first sub-pixel driving circuit SPC1 and the structure of the fourth sub-pixel driving circuit SPC4 are substantially mirror-symmetrical relative to the position of the detection line SL, and the structure of the second sub-pixel driving circuit SPC2 and the structure of the third sub-pixel driving circuit SPC3 are substantially mirror-symmetrical relative to the position of the detection line SL.

It should be noted that mirror symmetry in the present disclosure means that the positional relationships, such as the left-right positional relationships, of respective structures are substantially symmetrical. For example, for two sub-pixel structures which are substantially mirror-symmetrical, if A structure is on the left side of B structure in one sub-pixel, A structure is on the right side of B structure in the other sub-pixel. For example, mirror symmetry may also mean that shapes, sizes or the orientations of respective structures are substantially symmetrical relative to a certain straight line (for example, a row direction line or a column direction line). For example, for two sub-pixel structures which are substantially mirror-symmetrical, if A structure protrudes to the left in one sub-pixel, a corresponding A' structure protrudes to the right in the other sub-pixel. The corresponding A' structure may be a pattern located in the same layer as the A structure and has the same function as the A structure.

FIGS. 11 to 26 are schematic views of the display panel during the manufacturing process according to some embodiments of the disclosure, showing the structure of one pixel P of the transparent display panel. In the embodiments, for example, the transparent display panel is a top-emission OLED display panel for description. A single pixel P includes a display area DA and a light-transmitting area TA. The display area DA is provided with a first sub-pixel driving circuit SPC1, a second sub-pixel driving circuit SPC2, a third sub-pixel driving circuit SPC3 and a fourth sub-pixel driving circuit SPC4 that are sequentially arranged away from the light-transmitting area TA. The pixel driving circuit of each sub-pixel includes a first transistor T1, a second transistor T2, a third transistor T3 and a storage capacitor Cst.

Figure 12:
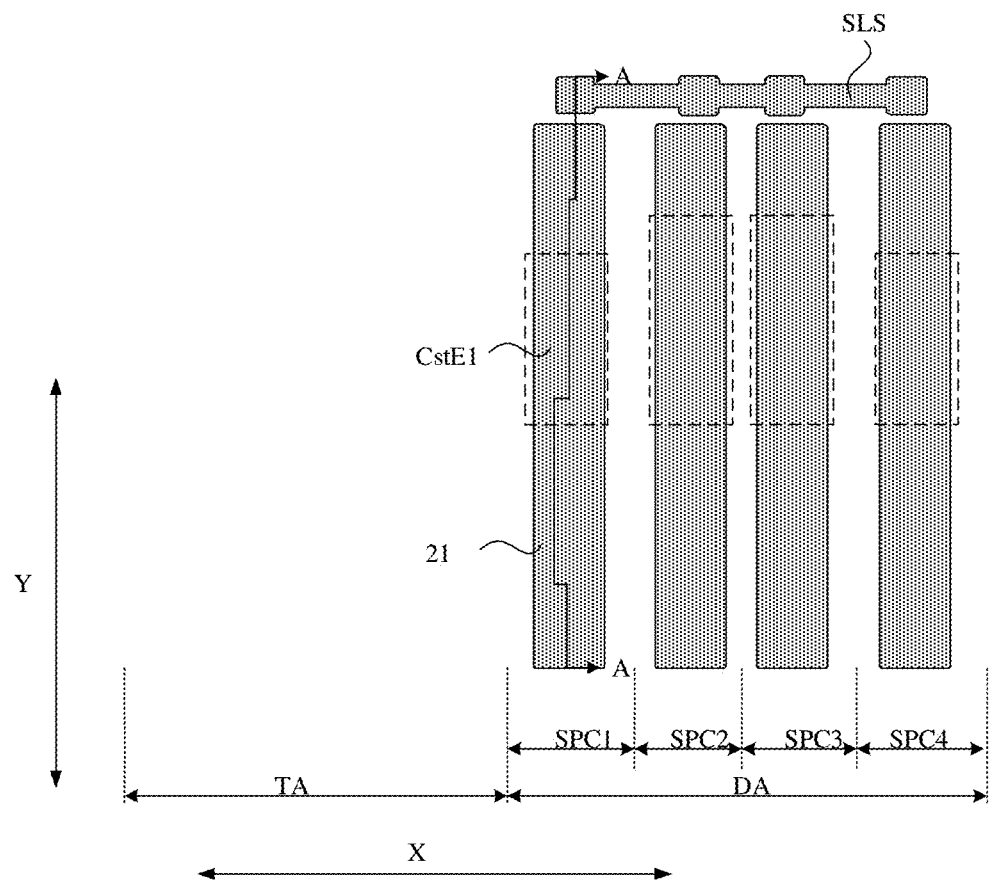
FIG. 12 is a schematic plan view of a single pixel after a pattern of a first metal layer is formed in a manufacturing process of a transparent display panel according to some embodiments of the present disclosure.
Figure 13:
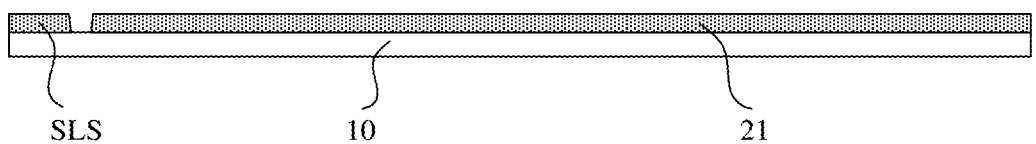
FIG. 13 is a schematic cross-sectional view along line A-A in FIG. 12.

FIG.12 is a schematic plan view of a single pixel after a pattern of a first metal layer is formed in the manufacturing process of a transparent display panel according to some embodiments of the present disclosure, and FIG. 13 is a schematic cross-sectional view along the line AA in FIG. 12. It should be noted that the cutting position indicated by the line A-A in FIG. 12 is consistent with the cutting position indicated by the line A-A in other subsequent drawings. As shown in FIGS. 12 and 13, the pattern of the first metal layer 20 is firstly formed on the base substrate. Specifically, a first metal film is deposited on the base substrate 10, and the first metal film is patterned through a patterning process to form a pattern of the first metal layer 20 on the base substrate 10. The pattern of the first metal layer 20 includes a shielding layer 21 and a detection connection line SLS. Each sub-pixel driving circuit includes one shielding layer 21, and the detection connection line SLS is a strip-shaped structure extending in the first direction X and stretching over four sub-pixel driving circuits. The detection connection line SLS is configured to be connected to the detection line SL formed subsequently, so that the detection line SL provides a reset signal to each sub-pixel driving circuit, and is used for sampling and detecting the electrical characteristics, such as the threshold voltage of the second transistor T2, of each sub-pixel driving circuit, so as to achieve external compensation. In some embodiments, the shielding layer 21 is in a shape of an elongated rectangle and extends in the second direction Y. The shielding layer 21 is configured to be a light-shielding layer for the channel of each transistor formed subsequently, thereby reducing the intensity of light irradiated on the transistors, reducing leakage currents, and reducing the influence of light on the characteristics of the transistors. At least a middle part of the shielding layer 21 (encircled by the dashed frame) serves as a capacitor electrode of the first capacitor, namely the first capacitor electrode CstE1, which is configured to form a first capacitor together with the second capacitor electrode CstE2 formed subsequently. In the second direction Y, the length of the shielding layer 21 is greater than a distance between the gate electrode of the switching transistor T1 formed subsequently and the gate electrode of the detection transistor T3 formed subsequently. In some embodiments, the length of the shielding layer 21 is greater than a distance between the drain electrode of the switching transistor T1 formed subsequently and the drain electrode of the third transistor T3 formed subsequently. As shown in FIGS.11 and 12, the pattern of the first metal layer 20 in the first sub-pixel driving circuit SPC1 and the pattern of the first metal layer 20 in the fourth sub-pixel driving circuit SPC4 are mirror-symmetric relative to the detection line SL formed subsequently. The pattern of the first metal layer 20 in the second sub-pixel driving circuit SPC2 and the pattern of the first metal layer 20 in the third sub-pixel driving circuit SPC3 are substantially mirror-symmetrical relative to the position of the detection line SL subsequently formed. After this patterning process, the shielding layer 21 and the detection connection line SLS are formed in the display area DA, and the first metal layer is not provided in the light-transmitting area TA.

Figure 14:
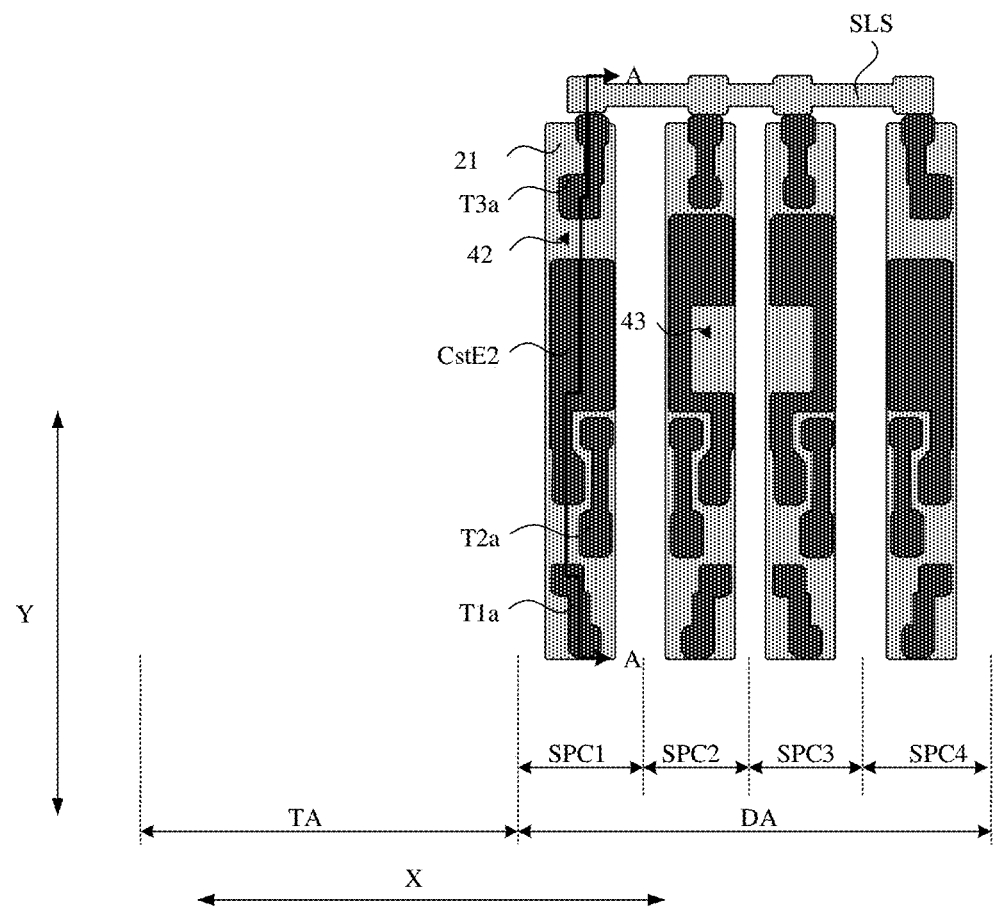
FIG. 14 is a schematic plan view of a single pixel after a pattern of an active material layer is formed in a manufacturing process of a transparent display panel according to some embodiments of the present disclosure.
Figure 15:
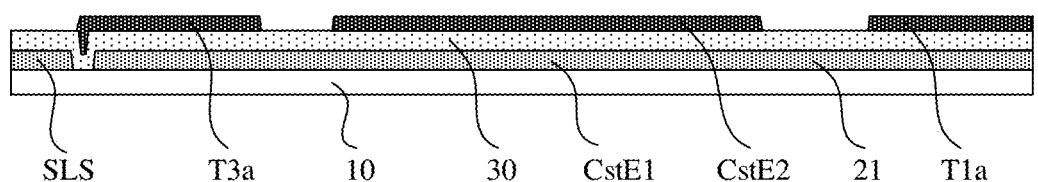
FIG. 15 is a schematic cross-sectional view along line A-A in FIG. 14.

FIG.14 is a schematic plan view of a single pixel after a pattern of an active material layer is formed in the manufacturing process of a transparent display panel according to some embodiments of the present disclosure, and FIG. 15 is a schematic cross-sectional view along the line A-A in FIG. 14. Then, as shown in FIGS. 14 and 15, a pattern of the active material layer 40 is formed. Specifically, a first insulating film and an active material film are sequentially deposited on the base substrate 10 on which the aforementioned patterns have been formed, and the active material film is for example, a metal oxide film. The active material film is patterned through a patterning process to form a first insulating layer 30 covering the pattern of the first metal layer 20, and a pattern of the active material layer 40 formed on the first insulating layer 30. The active material layer 40 includes an active layer (also referred to as a first active layer T1a) of the switching transistor T1, an active layer (also referred to as a second active layer T2a) of the driving transistor T2, an active layer (also referred to as to third active layer T3a) of the detection transistor T3 and the second capacitor electrode CstE2 which are provided in each sub-pixel driving circuit. An orthographic projection of the second capacitor electrode CstE2 on the base substrate 10 and an orthographic projection of the first capacitor electrode CstE1 on the base substrate 10 have an overlapping area, and the first capacitor electrode CstE1 and the second capacitor electrode CstE2 form the first capacitor.

In some embodiments, an orthographic projection of each of the first active layer T1a, the second active layer T2a, and the third active layer T3a on the base substrate 10 and the orthographic projection of the shielding layer 21 on the base substrate 10 have an overlapped area, so that the shielding layer 21 may shield the channel areas of the switching transistor T1, the driving transistor T2 and the detection transistor T3 to prevent light from affecting the channel, thereby avoiding affecting the display effect due to generation of photo-generated leakage current in the channel area. Any two of the first active layer T1a, the second active layer T2a, the third active layer T3a, and the second capacitor electrode CstE2 are spaced apart from each other, that is, any two of the orthographic projection of the first active layer T1a on the base substrate 10, the orthographic projection of the second active layer T2a on the base substrate 10, the orthographic projection of the third active layer T3a on the base substrate 10, and the orthographic projection of the second capacitor electrode CstE2 on the base substrate 10 do not overlap each other, which is beneficial to designing the width-to-length ratio of the channel area of each of the switching transistor T1, the driving transistor T2 and the detection transistor T3 according to related requirements. In some embodiments, as shown in FIGS. 14 and 15, in the first sub-pixel driving circuit SPC1 and the fourth sub-pixel driving circuit SPC4, a spacing region 42 is provided between the second capacitor electrode CstE2 and the third active layer T3a. There is also an interval between the second capacitor electrode CstE2 and the third active layer T3a in the second sub-pixel driving circuit SPC2 and the third sub-pixel driving circuit SPC3. As shown in FIG. 14, the spacing region 42 in the first sub-pixel driving circuit SPC1 and the fourth sub-pixel driving circuit SPC4 is larger than the interval in the second sub-pixel driving circuit SPC2 and the third sub-pixel driving circuit SPC3, so as to facilitate the subsequent formation of via holes at the spacing region 42 in the first sub-pixel driving circuit SPC1 and the fourth sub-pixel driving circuit SPC4. A notch region 43 is provided in the middle of the second capacitor electrode CstE2 in each of the second sub-pixel driving circuit SPC2 and the third sub-pixel driving circuit SPC3. There is no active material layer 40 in the spacing region 42 and the notch region 43. In some embodiments, as shown in FIG. 11 and FIG. 14, the pattern of the active material layer 40 in the first sub-pixel driving circuit SPC1 and the pattern of the active material layer 40 in the fourth sub-pixel driving circuit SPC4 are substantially mirror-symmetrical relative to the position of the detection line SL formed subsequently, and the pattern of the active material layer 40 in the second sub-pixel driving circuit SPC2 and the pattern of the active material layer 40 in the third sub-pixel driving circuit SPC3 are substantially mirror-symmetrical relative to the position of the detection line SL formed subsequently. After this patterning process, the pattern of the active material layer 40 is formed in the display area DA but not in the light-transmitting area TA. The light-transmitting area TA includes the base substrate 10 and the first insulating layer 30 provided on the base substrate 10.

Figure 16:
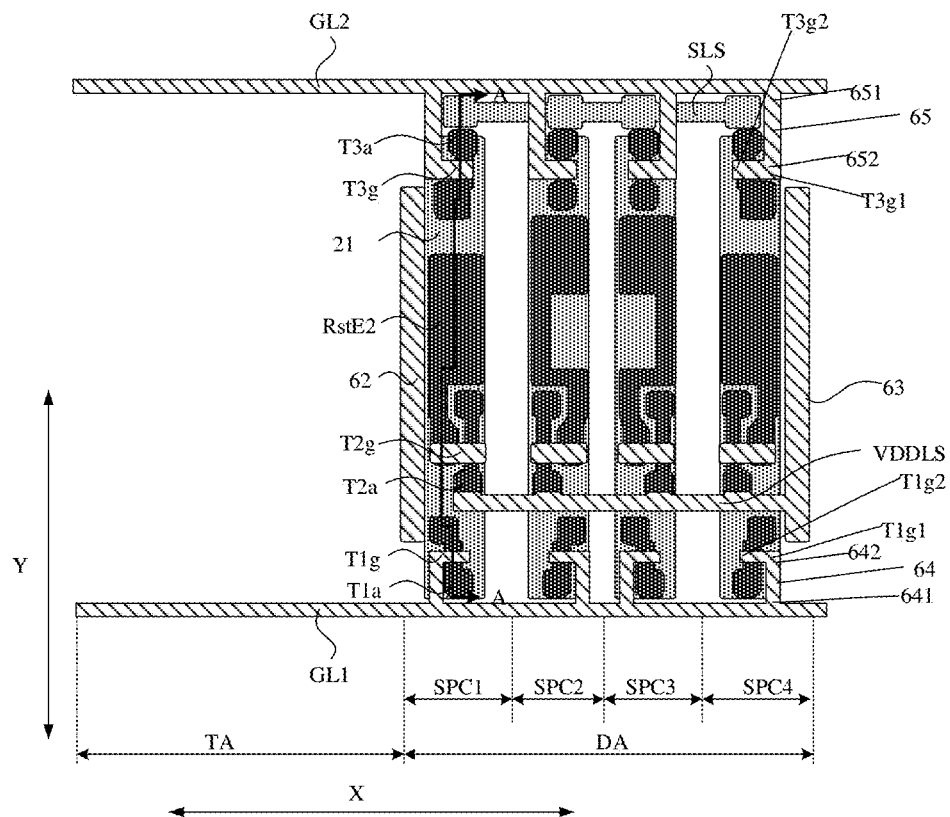
FIG. 16 is a schematic plan view of a single pixel after a pattern of a second metal layer is formed in a manufacturing process of a transparent display panel according to some embodiments of the present disclosure.
Figure 17:
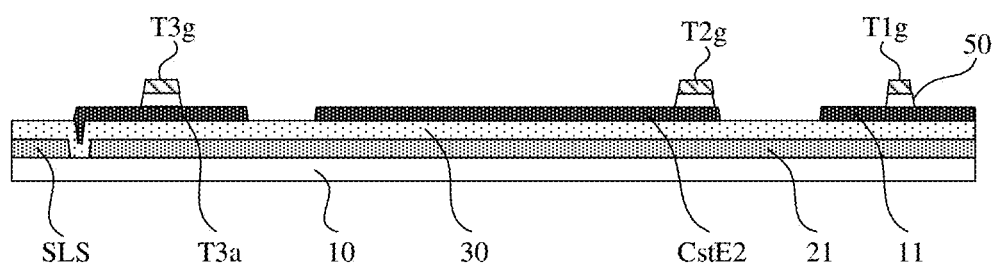
FIG. 17 is a schematic cross-sectional view along line A-A in FIG. 16.

FIG. 16 is a schematic plan view of a single pixel after a pattern of a second metal layer is formed in the manufacturing process of a transparent display panel according to some embodiments of the present disclosure, and FIG. 17 is a schematic cross-sectional view along the line A-A in FIG. 16. As shown in FIGS. 16 and 17, then, a pattern of the second metal layer 60 is formed. Specifically, a second insulating film and a second metal film are sequentially deposited on the base substrate 10 on which the aforementioned patterns have been formed, and a patterning process is performed on the second insulating film and the second metal film to form the pattern of the second insulating layer 50 and the pattern of the second metal layer 60 disposed on the second insulating layer 50. In some embodiments, the pattern of the second insulating layer 50 and the pattern of the second metal layer 60 are formed by using the same mask, and both have the same pattern. The pattern of the second metal layer 60 includes a first gate line GL1, a second gate line GL2, a first power connection line VDDLS, a first auxiliary line 62, and a second auxiliary line 63 corresponding to each pixel P, and a gate electrode (also referred to as a first gate electrode T1g) of the switching transistor T1, a gate electrode (also referred to as a second gate electrode T2g) of the driving transistor T2 and a gate electrode (also referred to as a third gate electrode T3g) of the detection transistor T3 formed in each sub-pixel driving circuit. The pattern of the second metal layer 60 also includes a first gate connection line 64 and a second gate connection line 65 formed in each sub-pixel driving circuit. As shown in FIG. 16, in the region corresponding to the single pixel P, that is, in the region shown in FIG. 16, the first gate line GL1 and the second gate line GL2 are arranged in parallel, and both extend straightly in the first direction X. The first gate line GL1 is located on the lower side of the light-transmitting area TA, and the second gate line GL2 is located on the upper side of the light-transmitting area TA. That is, the light-transmitting area TA is sandwiched between the first gate line GL1 and the second gate line GL2. Each sub-pixel driving circuit is also sandwiched between the first gate line GL1 and the second gate line GL2.

The first gate electrode T1g extends in the first direction X, crosses the first active layer T1a, and is electrically connected to the first gate line GL1 through the first gate connection line 64 extending in the second direction Y. Specifically, the first gate electrode T1g includes a connection end T1g1 and a free end T1g2, and the first gate connection line 64 includes a first end 641 and a second end 642. The first end 641 of the first gate connection line 64 is electrically connected to the first gate line GL1, and the second end 642 of the first gate connection line 64 is electrically connected to the connection end T1g1 of the first gate electrode T1g. In some embodiments, the first gate electrode T1g, the first gate connection line 64, and the first gate line GL1 are in an integral structure. The second gate electrode T2g extends in the first direction X, crosses the second active layer T2a, and has an overlapping area with the second capacitor electrode CstE2. The third gate electrode T3g extends in the first direction X, crosses the third active layer T3a, and is electrically connected to the second gate line GL2 through the second gate connection line 65 extending in the second direction Y. Specifically, the third gate electrode T3g includes a connection end T3g1 and a free end T3g2, and the second gate connection line 65 includes a first end 651 and a second end 652. The first end 651 of the second gate connection line 65 is electrically connected to the second gate line GL2, and the second end 652 of the second gate connection line 65 is electrically connected to the connection end T3g1 of the third gate electrode T3g. In some embodiments, the third gate electrode T3g, the second gate connection line 65 and the second gate line GL2 are in an integral structure.

The first auxiliary line 62 is formed in a region where the second power line VSSL is located. The first auxiliary line 62 extends in the second direction Y, and is configured to be electrically connected to the second power line VSSL formed subsequently. In this way, the second power line VSSL to be formed subsequently is arranged in parallel with the first auxiliary line 62 through a via hole, thereby effectively reducing the impedance of the second power line VSSL. In some embodiments, in the second direction Y, the first auxiliary line 62 is located between the first gate electrode T1g and the third gate electrode T3g. Those skilled in the art may understand that the first auxiliary line 62 is not necessary, and in some embodiments, the first auxiliary line 62 may be omitted.

The second auxiliary line 63 is formed in a region where the first power line VDDL is located. The second auxiliary line 63 extends in the second direction Y, and is configured to be electrically connected to the first power line VDDL formed subsequently. Therefore, the first power line VDDL to be formed subsequently is arranged in parallel with the second auxiliary line 63 through a via hole, thereby effectively reducing the impedance of the first power line VDDL. In some embodiments, in the second direction Y, the second auxiliary line 63 is located between the first gate electrode T1g and the third gate electrode T3g. Those skilled in the art may understand that the second auxiliary line 63 is not necessary, and in some embodiments, the second auxiliary line 63 may be omitted.

The first power connection line VDDLS extends in the first direction X, spans the four sub-pixel driving circuits, and is configured to be electrically connected to the first power line VDDL formed subsequently. In some embodiments, the first power connection line VDDLS and the second auxiliary line 63 may be electrically connected to each other, and they are, for example, in an integral structure.

As shown in FIG. 17, the pattern of the second insulating layer 50 is the same as that of the second metal layer 60, that is, the second insulating layer 50 is located under the second metal layer 60, and there is no second insulating layer 50 in the area except the second metal layer 60. As shown in FIG. 16, except the first power connection line VDDLS, the pattern of the second metal layer in the first sub-pixel driving circuit SPC1 and the pattern of the second metal layer in the fourth sub-pixel driving circuit SPC4 are substantially mirror-symmetrical relative to the position of the detection line SL formed subsequently, and the pattern of the second metal layer in the second sub-pixel driving circuit SPC2 and the pattern of the second metal layer in the third sub-pixel driving circuit SPC3 are substantially mirror-symmetrical relative to the position of the detection line SL formed subsequently.

In some embodiments, this process also includes conduction treatment. In a process of the conduction treatment, the pattern of the second metal layer 60 including the first gate electrode T1g, the second gate electrode T2g and the third gate electrode T3g as a shield to perform a plasma treatment after the pattern of the second metal layer 60 is formed. Portions of the active material layer 40 shielded by the first gate electrode T1g, the second gate electrode T2g, and the third gate electrode T3g (that is, the overlapped areas of the active material layer 40 with the first gate electrode T1g, the second gate electrode T2g and the third gate electrode T3g) respectively serve as the channel areas of the transistors. Portions of the active material layer 40 which are not shielded by the second metal layer 60 is made conductive, to form a conductive second capacitor electrode CstE2 and a conductive source and drain region. After this patterning process, the pattern of the second metal layer 60 is formed in the display area DA but not in the light-transmitting area TA. The light-transmitting area TA includes the base substrate 10 and the first insulating layer 30 provided on the base substrate 10.

Figure 18:
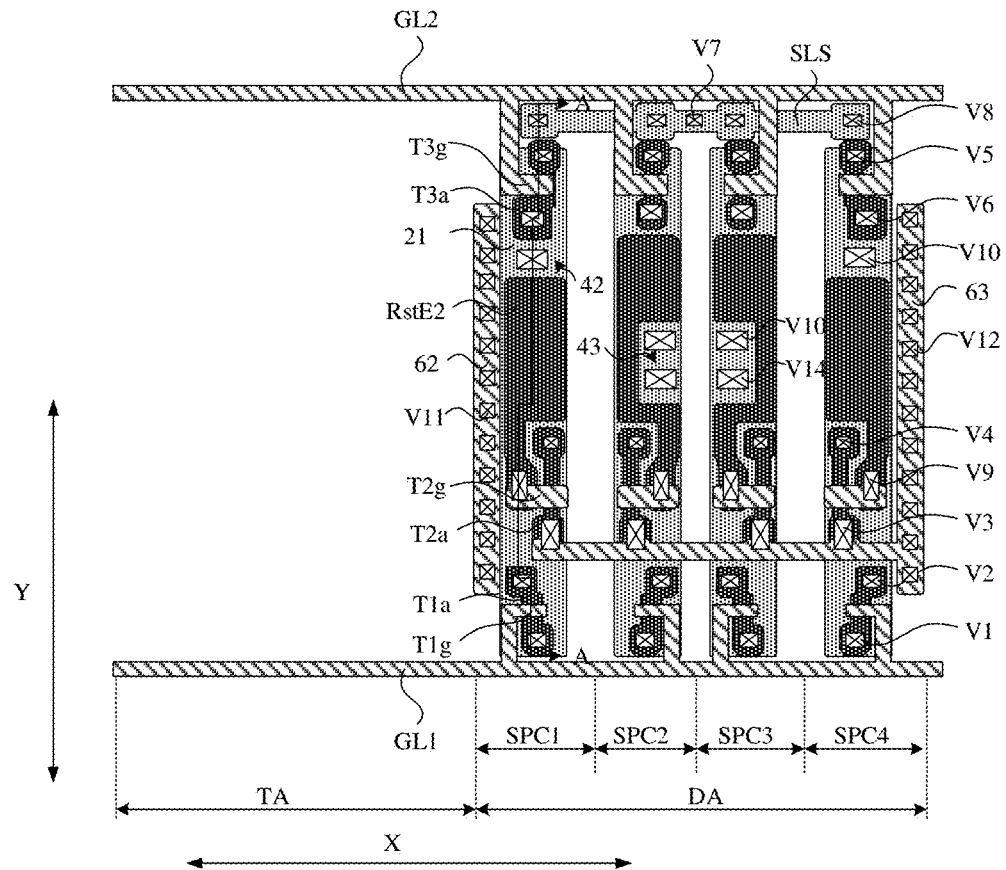
FIG. 18 is a schematic plan view of a single pixel after a pattern of a third insulating layer is formed in a manufacturing process of a transparent display panel according to some embodiments of the present disclosure.
Figure 19:
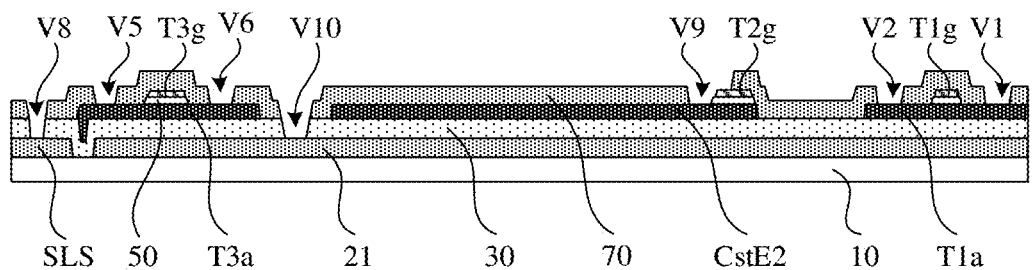
FIG. 19 is a schematic cross-sectional view along line A-A in FIG. 18.

FIG. 18 is a schematic plan view of a single pixel after a pattern of a third insulating layer is formed in the manufacturing process of the transparent display panel according to some embodiments of the present disclosure, and FIG. 19 is a schematic cross-sectional view along the line A-A in FIG. 18. As shown in FIGS. 18 and 19, a pattern of the third insulating layer 70 is then formed. Forming the pattern of the third insulating layer 70 includes: a third insulating film is deposited on the base substrate 10 on which the aforementioned patterns have been formed, and the third insulating film is patterned through a patterning process to form the pattern of the third insulating layer 70 covering the aforementioned structures. The third insulating layer 70 is provided with a plurality of via holes, and the plurality of via holes include: a first via hole V1 and a second via hole V2 respectively located on both sides of the first gate electrode T1g, a third via hole V3 and a fourth via hole V4 respectively located on both sides of the second gate electrode T2g, a fifth via hole V5 and a sixth via hole V6 respectively located on both sides of the third gate electrode T3g, a seventh via hole V7 at an overlapping position of the detection connection line SLS and the detection line, an eighth via hole V8 at an overlapping position of the detection connection line SLS and the drain electrode of the detection transistor T3, a ninth via hole V9 at the junction of the second gate electrode T2g and the second capacitor electrode CstE2, a tenth via hole V10 and a fourteenth via hole V14 at regions of the shielding layer 21 that are not covered by the active material layer 40, such as the spacing region 42 or the notch region 43. A plurality of eleventh via holes V11 are located at positions where the first auxiliary line 62 is located, and a plurality of twelfth via holes V12 are located at positions where the second auxiliary line 63 is located.

The third insulating layer 70 in the first via hole V1 and the second via hole V2 is etched away, to expose surfaces at both ends of the first active layer T1a. The third via hole V3 is disposed at the junction of the first power connection line VDDLS and the second active layer T2a, and the third insulating layer 70 in the third via hole V3 is etched away, so that a surface of the second active layer T2a and a surface of the first power connection line VDDLS are both exposed. The third insulating layer 70 in the fourth via hole V4 is etched away to expose the surface of a second active layer T2a. The third insulating layer 70 in the fifth via hole V5 and the sixth via hole V6 is etched away to expose the surfaces at both ends of the third active layer T3a. The seventh via hole V7 is located at the overlapping position of the detection connection line SLS and the detection line SL formed subsequently. Each sub-pixel driving circuit is provided with one eighth via hole V8. The first insulating layer 30 and the third insulating layer 70 in the seventh via hole V7 and the eighth via hole V8 are etched away to expose the surface of the detection connection line SLS. The ninth via hole V9 is located at the junction of the second gate electrode T2g and the second capacitor electrode CstE2. The third insulating layer 70 in the ninth via hole V9 is etched away to expose the surface of the second gate electrode T2g and the surface of the second capacitor electrode CstE2. In the first sub-pixel driving circuit SPC1 and the fourth sub-pixel driving circuit SPC4, an orthographic projection of the tenth via hole V10 on the base substrate 10 is located within an orthographic projection of the spacing region 42 located between the second capacitor electrode CstE2 and the third active layer T3a on the base substrate 10. In the second sub-pixel driving circuit SPC2 and the third sub-pixel driving circuit SPC3, an orthographic projection of the tenth via hole V10 on the base substrate is located within an orthographic projection of the notch region 43 located in the middle of the second capacitor electrode CstE2 on the base substrate 10. The first insulating layer 30 and the third insulating layer 70 in the tenth via hole V10 are etched away to expose the surface of the shielding layer 21.

The third insulating layer 70 in the fourteenth via hole V14 is etched away to expose the first insulating layer 30. The fourteenth via hole V14 is designed for process symmetry and is only formed in the second sub-pixel driving circuit SPC2 and the third sub-pixel driving circuit SPC3. An orthographic projection of the fourteenth via hole V14 on the base substrate 10 is located within the orthographic projection of the notch region 43 located in the middle of the second capacitor electrode CstE2 on the base substrate 10. The fourteenth via hole V14 is absent in the first sub-pixel driving circuit SPC1 and the fourth sub-pixel driving circuit SPC4. In the subsequent process, a thirteenth via hole V13 for connecting to the anode is formed in each sub-pixel driving circuit. In the first sub-pixel driving circuit SPC1 and the fourth sub-pixel driving circuit SPC4, the thirteenth via hole V13 formed subsequently covers the sixth via hole V6 that only penetrates the third insulating layer 70 to form a combined hole. In the second sub-pixel driving circuit SPC2 and the third sub-pixel driving circuit SPC3, the thirteenth via hole V13 formed subsequently is located at the notch region 43 and close to the tenth via hole V10. For the process symmetry of the sub-pixel driving circuits, in the second sub-pixel driving circuit SPC2 and the third sub-pixel driving circuit SPC3, the fourteenth via hole V14 is formed at the position of the thirteenth via hole V13, and the fourteenth via hole V14 is similar to the sixth via hole V6 in the first sub-pixel driving circuit SPC1 and the fourth sub-pixel driving circuit SPC4, so that the thirteenth via hole V13 formed subsequently cover the fourteenth via hole V14 to form a combined hole. The fourteenth via hole V14 is not necessary, and in some embodiments, the fourteenth via hole may not be provided.

The eleventh via holes V11 is located on the first auxiliary line 62, that is, orthographic projections of the plurality of eleventh via holes V11 on the base substrate 10 fall within the orthographic projection of the first auxiliary line 62 on the base substrate 10. The plurality of eleventh via holes V11 are arranged at intervals, and the third insulating layer 70 in the eleventh via holes V11 is etched away to expose the surface of the first auxiliary line 62.

The plurality of twelfth via holes V12 are located on the second auxiliary line 63, and orthographic projections of the plurality of twelfth via holes V12 on the base substrate 10 fall within the orthographic projection of the second auxiliary line 63 on the base substrate 10. The plurality of twelfth via holes V12 are arranged at intervals, and the third insulating layer 70 in the twelfth via holes V12 is etched away to expose the surface of the second auxiliary line 63. After this patterning process, a plurality of via holes are formed in the display area DA, and the light-transmitting area TA includes the first insulating layer 30 and the third insulating layer 70 stacked on the base substrate 10.

Figure 20:
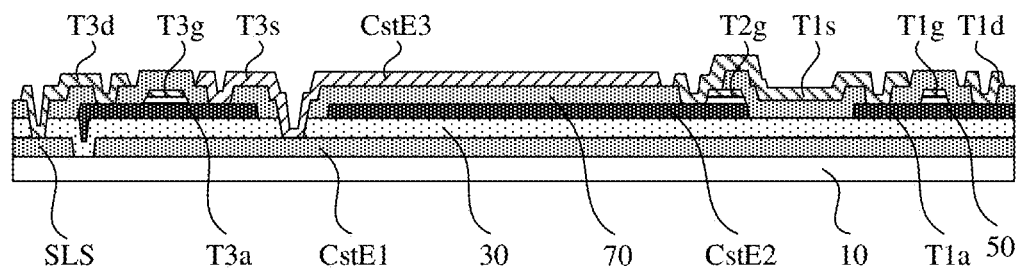
FIG. 20 is a schematic cross-sectional view along line A-A in FIG. 11.

FIG. 11 is a schematic plan view of a single pixel after a pattern of a third metal layer is formed in the manufacturing process of a transparent display panel according to some embodiments of the present disclosure, and FIG. 20 is a schematic cross-sectional view along line A-A in FIG. 11. As shown in FIGS. 11 and 20, the pattern of the third metal layer 80 is then formed. Specifically, a third metal film is deposited on the base substrate on which the aforementioned patterns have been formed, and the third metal film is patterned through a patterning process to form the pattern of the third metal layer on the third insulating layer 70. The third metal layer 80 includes: a first power line VDDL, a second power line VSSL, a detection line SL, and four data lines DL corresponding to each pixel P, the source electrode and the drain electrode (also referred to as the first source electrode T1*s* and the first drain electrode T1*d*) of the switching transistor T1 formed in each sub-pixel, the source electrode and the drain electrode (also referred to as the second source electrode T2*s* and the second drain electrode T2*d*) of the driving transistor T2 formed in each sub-pixel, the source electrode and the drain electrode (also referred to as the third source electrode T3*s* and the third drain electrode T3*d*) of the detection transistor T3 formed in each sub-pixel, and the third capacitor electrode CstE3. FIG. 20 is a schematic cross-sectional view along the line AA in FIG. 11. As shown in FIGS. 11 and 20, the first drain electrode T1*d* and the first source electrode T1*s* are electrically connected to conductive ends of the first active layer T1*a* on both sides of the first gate electrode T1*g* through the first via hole V1 and the second via hole V2, respectively, so as to form the switching transistor T1. The second drain electrode T2*d* and the second source electrode T2*s* are electrically connected to conductive ends of the second active layer T2*a* on both sides of the second gate electrode T2*g* through the third via hole V3 and the fourth via hole V4, respectively, so as to form the driving transistor T2, moreover, the second drain electrode T2*d* is also electrically connected to the first power connection line VDDLS through the third via hole V3. The third drain electrode T3*d* and the third source electrode T3*s* are electrically connected to conductive ends of the third active layer T3*a* on both sides of the third gate electrode T3*g* through the fifth via hole V5 and the sixth via hole V6, respectively, so as to form the detection transistor T3. In addition, the third drain electrode T3*d* is also electrically connected to the detection connection line SLS through the eighth via hole V8, and the detection line SL is electrically connected to the detection connection line SLS through the seventh via hole, so that the detection line and the drain electrode T3*d* of the detection transistor T3 of each sub-pixel driving circuit is electrically connected. The first source electrode T1*s* is also electrically connected to the second gate electrode T2*g* and the second capacitor electrode CstE2 through the ninth via hole V9, and the ninth via hole V9 may be regarded as the first node G in FIG. 10. The third capacitor electrode CstE3 is electrically connected to the shielding layer 21 through the tenth via hole V10, and fills the fourteenth via hole V14. The third capacitor electrode CstE3 is electrically connected to the second source electrode T2*s* and the third source electrode T3*s*, and they may be in an integral structure. The second power line VSSL is electrically connected to the first auxiliary line 62 through the plurality of eleventh via holes V11 to reduce the transmission resistance of the second power line VSSL. The first power line VDDL is electrically connected to the second auxiliary line 63 through the plurality of twelfth via holes V12 to reduce the transmission resistance of the first power line VDDL, and the VDD voltage signal is transmitted to the second drain electrode T2*d* of the driving transistor T2 through the second auxiliary line 63 and the first power connection line VDDLS. As shown in FIG. 11, the pattern of the third metal layer 80 in the first sub-pixel driving circuit SPC1 and the pattern of the third metal layer 80 in the fourth sub-pixel driving circuit SPC4 are substantially mirror-symmetrical relative to the position of the formed detection line SL, the pattern of the third metal layer 80 in the second sub-pixel driving circuit SPC2 and the pattern of the third metal layer 80 in the third sub-pixel driving circuit SPC3 are substantially mirror-symmetrical relative to the position of the formed detection line SL.

After this patterning process, the pattern of the third metal layer 80 is formed in the display area DA but not in the light-transmitting area TA. The light-transmitting area TA includes the base substrate 10 as well as the first insulating layer 30 and third insulating layer 70 both disposed on the base substrate 10.

Figure 21:
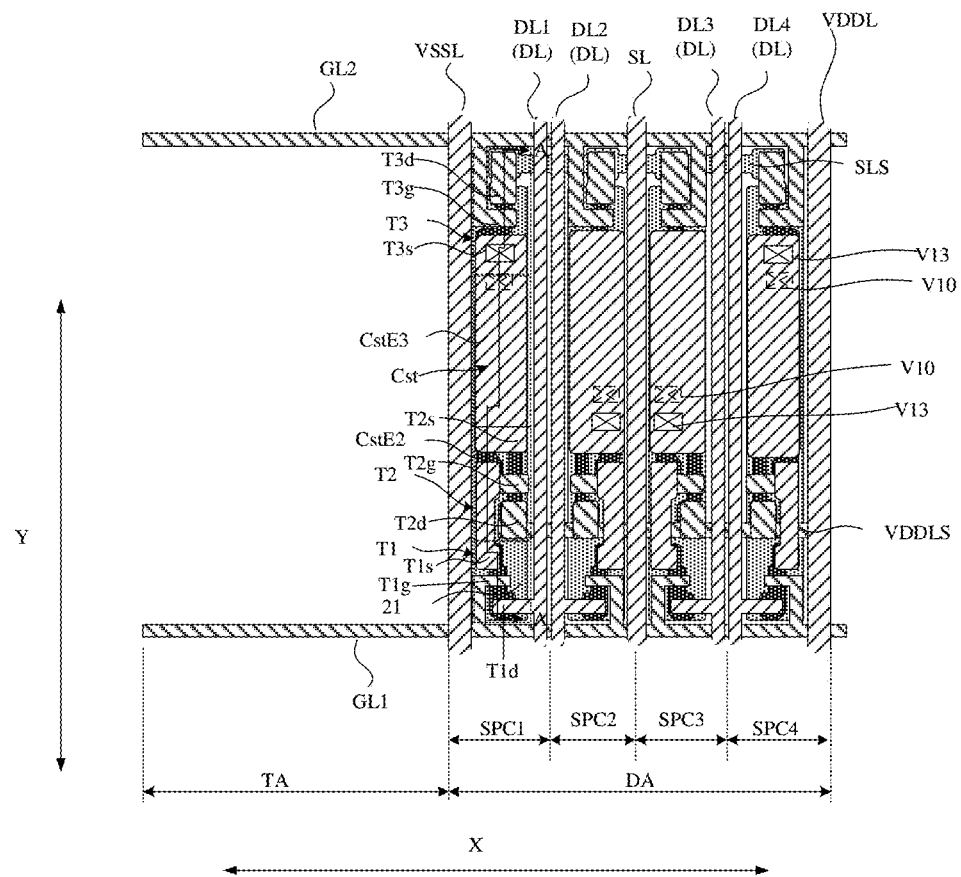
FIG. 21 is a schematic plan view of a single pixel after patterns of a fourth insulating layer and a planarization layer are formed in a manufacturing process of a transparent display panel according to some embodiments of the present disclosure.
Figure 22:
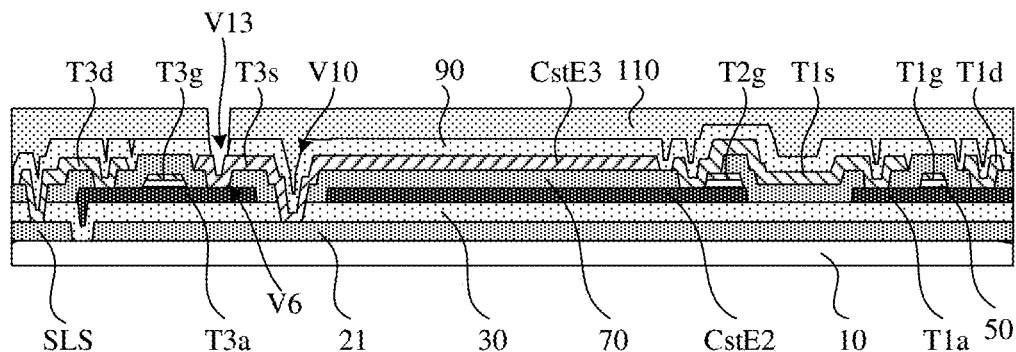
FIG. 22 is a schematic cross-sectional view along line A-A in FIG. 21.

FIG. 21 is a schematic plan view of a single pixel after patterns of a fourth insulating layer and a planarization layer are formed in a manufacturing process of a transparent display panel according to some embodiments of the present disclosure. FIG. 22 is a schematic cross-sectional view along line A-A in FIG. 21. Then, as shown in FIGS. 21 and 22, patterns of the fourth insulating layer 90 and the planarization layer 110 are formed. Specifically, a fourth insulating film is deposited on the base substrate 10 on which the aforementioned patterns have been formed. A patterning process, such as exposure, development, and etching, is performed on the fourth insulating film, to form the pattern of the fourth insulating layer 90. The pattern of the fourth insulating layer 90 is provided with a via hole in each pixel sub-driving circuit. Then, a planarization film is coated on the base substrate 10 on which the pattern of the fourth insulating layer 90 is formed, and the pattern of the planarization layer 110 is formed through a patterning process of the planarization film, such as exposure, development, and etching. The pattern of the planarization layer 110 is only arranged in the display area DA of the pixel P, not in the light-transmitting area TA. The pattern of the planarization layer 110 is also provided with a via hole in each sub-pixel driving circuit. In each sub-pixel driving circuit, The via hole of the planarization layer 110 is aligned with the via hole of the fourth insulating layer 90, and the aligned via holes form the thirteenth via hole V13 that penetrates the planarization layer 110 and the fourth insulating layer 90. The size of the thirteenth via hole V13 is substantially larger than that of other via holes. In some embodiments, as shown in FIGS. 21 and 22, in the first sub-pixel driving circuit SPC1 and the fourth sub-pixel driving circuit SPC4, the thirteenth via hole V13 is located at the position where the source electrode T3s of the detection transistor T3 is located. Specifically, the thirteenth via hole V13 covers the sixth via hole V6, that is, the orthographic projection of the sixth via hole V6 on the base substrate 10 falls within the orthographic projection of the thirteenth via hole V13 on the base substrate 10. In this way, the layout space may be saved, and the opening area of the pixel defining layer formed subsequently may be as large as possible. The fourth insulating layer 90 and the planarization layer 110 in the thirteenth via hole V13 are etched away, to expose the surface of the source electrode T3s of the detection transistor T3. In the second sub-pixel driving circuit SPC2 and the third sub-pixel driving circuit SPC3, the thirteenth via hole V13 is located at the position where the notch 43 of the second capacitor electrode CstE2 is located, and adjacent to the tenth via hole V10. In some embodiments, the thirteenth via hole V13 covers the fourteenth via hole V14, that is, the orthographic projection of the fourteenth via hole V14 on the base substrate 10 falls within the orthographic projection of the thirteenth via hole V13 on the base substrate 10. As a result, a combined-hole structure similar to that in the first sub-pixel driving circuit SPC1 and the fourth sub-pixel driving circuit SPC4 is formed, which improves the process uniformity. The fourth insulating layer 90 and the planarization layer 110 in the thirteenth via hole V13 are etched away to expose the surface of the third capacitor electrode CstE3. In each sub-pixel driving circuit, the thirteenth via hole V13 is adjacent to the tenth via hole V10, and the two via holes are aligned in the second direction Y, that is, a straight line connecting a center of the thirteenth via hole V13 and a center of the tenth via hole V10 is parallel to the second direction Y. In the first sub-pixel driving circuit SPC1 and the fourth sub-pixel driving circuit SPC4, the thirteenth via hole V13 is closer to the second gate line GL2 than the tenth via hole V10. In the second sub-pixel driving circuit SPC2 and the third sub-pixel driving circuit SPC3, the thirteenth via hole V13 is farther away from the second gate line GL2 than the tenth via hole V10. Those skilled in the art should understand that the tenth via hole V10 of each sub-pixel driving circuit should be shielded by the fourth insulating layer 90 and the planarization layer 110, however, in order to clearly show the positional relationship between the tenth via hole V10 and the thirteenth via hole V13, the tenth via hole V10 of each sub-pixel driving circuit is shown in a dotted pattern in FIG. 21. As shown in FIG. 21, the patterns of the fourth insulating layer 90 and the planarization layer 110 in the first sub-pixel driving circuit SPC1 and the patterns of the fourth insulating layer 90 and the planarization layer 110 in the fourth sub-pixel driving circuit SPC4 are substantially mirror-symmetrical relative to the position of the detection line SL. The patterns of the fourth insulating layer 90 and the planarization layer 110 in the second sub-pixel driving circuit SPC2 and the patterns of the fourth insulating layer 90 and the planarization layer 110 in the third sub-pixel driving circuit SPC3 are substantially mirror-symmetrical relative to the position of the detection line SL. After this patterning process, the light-transmitting area TA includes the first insulating layer 30, the third insulating layer 70, and the fourth insulating layer 90 stacked on the base substrate 10.

Figure 23:
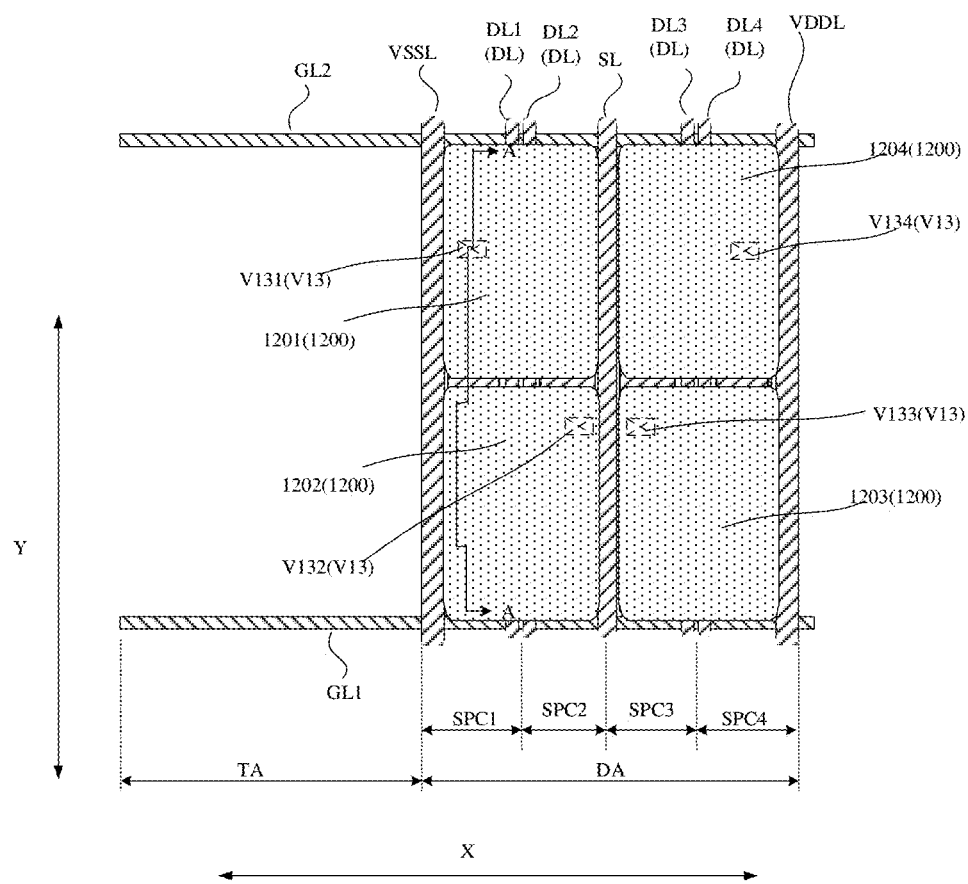
FIG. 23 is a schematic plan view of a single pixel after a pattern of an anode layer is formed in a manufacturing process of a transparent display panel according to some embodiments of the present disclosure.
Figure 24:
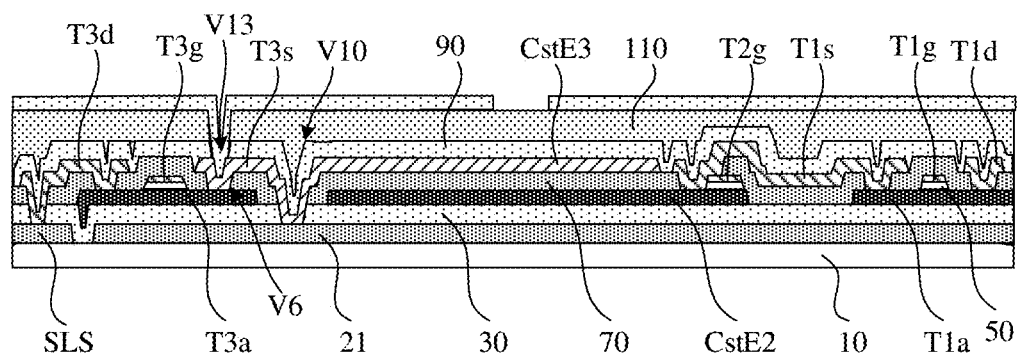
FIG. 24 is a schematic cross-sectional view along line A-A in FIG. 23.

FIG. 23 is a schematic plan view of a single pixel after a pattern of an anode layer is formed in a manufacturing process of a transparent display panel according to some embodiments of the present disclosure, and FIG. 24 is a schematic cross-sectional view along the line A-A in FIG. 23. Then, as shown in FIGS. 23 and 24, a pattern of the anode layer 120 is formed. Specifically, a conductive film, such as a laminated structure of aluminum, ITO, and aluminum, is deposited on the base substrate on which the aforementioned patterns have been formed, and the conductive film is patterned through a patterning process to form the pattern of the anode layer 120 on the planarization layer 110. The anode layer 120 includes at least an anode 1200 of the light-emitting element D of each sub-pixel, that is, a first anode 1201 of a first light-emitting element of a first sub-pixel, a second anode 1202 of a second light-emitting element of a second sub-pixel, a third anode 1203 of a third light-emitting element of a third sub-pixel and a fourth anode 1204 of a fourth light-emitting element of a fourth sub-pixel. In each sub-pixel driving circuit, the source electrode T2s of the driving transistor T2, the source electrode T3s of the detection transistor T3, and the third capacitor electrode CstE3 are connected to each other to form an integral structure. In each sub-pixel, the anode 1200 is electrically connected to the integral structure through the thirteenth via hole V13 (also referred to as an anode via hole V13 herein) in the corresponding sub-pixel driving circuit, so that the anode 1200 of each sub-pixel is electrically connected with the source electrode T2s of the driving transistor T2 of the corresponding sub-pixel driving circuit. In FIG. 23, the thirteenth via hole V13 of each sub-pixel driving circuit should be shielded by the anode 1200, however, in order to clearly show the positional relationship between the thirteenth via hole V13 and the anode 1200, the thirteenth via hole V13 of each sub-pixel driving circuit is shown by a dotted pattern in FIG. 23. In some embodiments, four anodes 1200 are all located in the display area DA, each anode 1200 may be rectangular, and the four anodes 1200 are arranged in a 2x2 matrix in the display area DA. In some embodiments, as shown in FIGS. 23 and 24, the first anode 1201 is located at the upper left and electrically connected to the source electrode T3s of the detection transistor T3 of the first sub-pixel driving circuit SPC1 through the thirteenth via hole V13 of the first sub-pixel driving circuit SPC1; the second anode 1202 is located at the lower left, and is electrically connected to the third capacitor electrode CstE3 of the second sub-pixel driving circuit SPC2 through the thirteenth via hole V13 of the second sub-pixel driving circuit SPC2; the third anode 1203 is located at the lower right, and electrically connected to the third capacitor electrode CstE3 of the third sub-pixel driving circuit SPC3 through the thirteenth via hole V13 of the third sub-pixel driving circuit SPC3; and the fourth anode 1204 is located at the upper right and electrically connected to the source electrode T3s of the detection transistor T3 of the fourth sub-pixel driving circuit SPC4 through the thirteenth via hole V13 of the fourth sub-pixel driving circuit SPC4.

In some optional embodiments, the arrangement of the anodes 1200 in the display area DA is adjustable according to actual needs, which is not specifically limited in the present disclosure. The anode layer 120 is usually not arranged in the light-transmitting area TA to ensure the light transmittance of the light-transmitting area TA. After this patterning process, the film structure of the light-transmitting area TA is unchanged.

Figure 25:
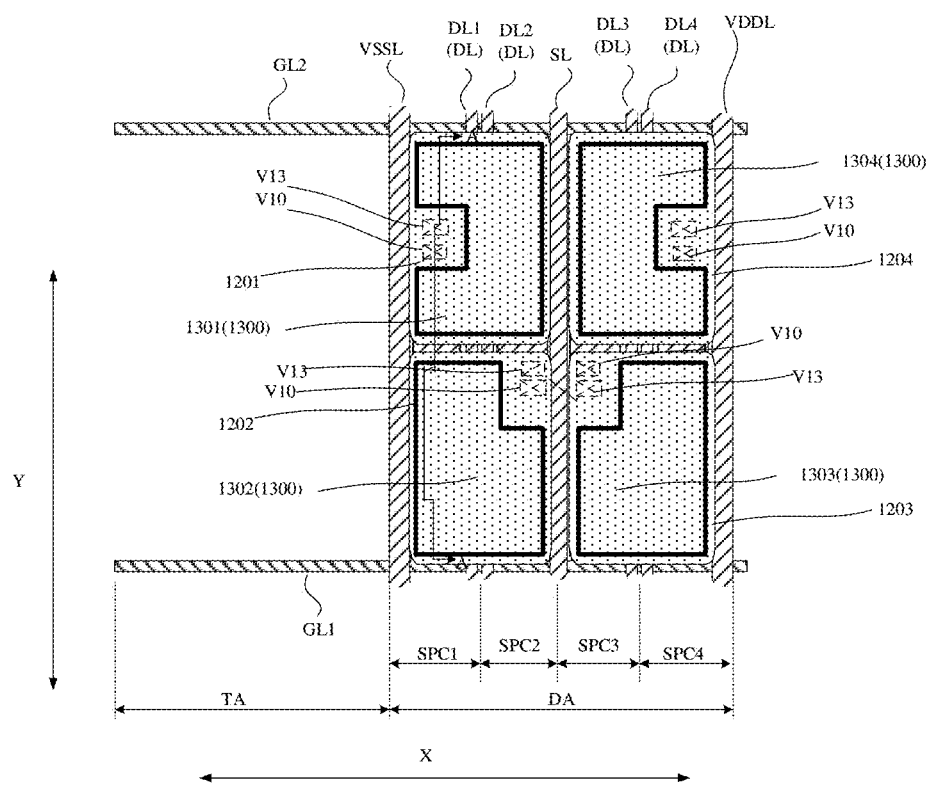
FIG. 25 is a schematic plan view of a single pixel after patterns of a pixel defining layer, a luminescent material layer, a cathode, and an encapsulation layer are formed in a manufacturing process of a transparent display panel to some embodiments of the present disclosure.
Figure 26:
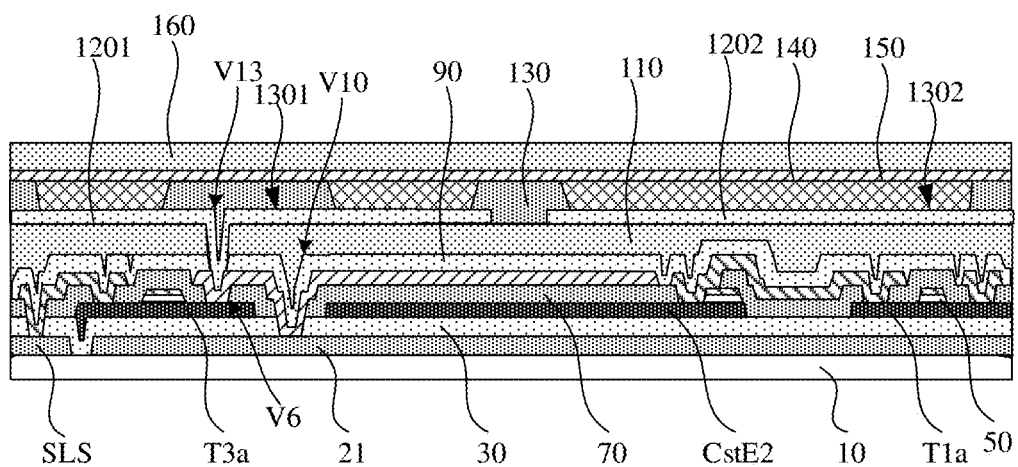
FIG. 26 is a schematic cross-sectional view along line A-A in FIG. 25

FIG. 25 is a schematic plan view of a single pixel after patterns of a pixel defining layer, a luminescent material layer, a cathode, and an encapsulation layer are formed in a manufacturing process of a transparent display panel according to some embodiments of the present disclosure. FIG. 26 is a schematic cross-sectional view along line A-A in FIG. 25. For clarity, FIG. 25 omits the patterns of the pixel defining layer, the luminescent material layer, the cathode, and the encapsulation layer, and only shows an opening of the pixel defining layer. The pixel defining layer, the luminescent material layer, the cathode, and the encapsulation layer are shown in FIG. 26. As shown in FIGS. 25 and 26, the patterns of the pixel defining layer, the luminescent material layer, the cathode and the encapsulation layer are formed. Specifically, a pixel defining film is coated on the base substrate 10 on which the aforementioned patterns have been formed, and the pattern of the pixel defining layer 130 is formed by using a mask and by processes of exposure and developing. The pixel defining layer 130 has an opening 1300 corresponding to the anode 1200 of each sub-pixel, namely a first opening 1301, a second opening 1302, a third opening 1303, and a fourth opening 1304 respectively corresponding to the first anode 1201, the second anode 1202, the third anode 1203, and the fourth anode 1204. The first opening 1301, the second opening 1302, the third opening 1303, and the fourth opening 1304 respectively define the light-emitting regions of the first light-emitting element, the second light-emitting element, the third light-emitting element, and the fourth light-emitting element. An orthographic projection of each opening 1300 on the base substrate 10 falls within an orthographic projection of its corresponding anode 1200 on the base substrate, and each opening 1300 exposes a part of its corresponding anode 1200. Subsequently, in some embodiments, a luminescent material layer 140 is formed in the aforementioned opening 1300, and the luminescent material layer 140 is electrically connected to the corresponding anode 1200. Optionally, in other embodiments, the luminescent material layer 140 is vapor-deposited on substantially the entire upper surface of the base substrate 10 on which the pixel defining layer 130 with the opening 1300 has been formed, and the luminescent material layer 140 located in the opening 1300 corresponds to the light-emitting area of each sub-pixel. Subsequently, a cathode film is deposited, and a pattern of the cathode layer 150 is formed through a patterning process. The cathode layer 150 includes at least the cathode of the light-emitting element D of each sub-pixel. The cathode layer 150 is electrically connected to the luminescent material layer 140 and the second power line VSSL, respectively. In some embodiments, as shown in FIGS. 25 and 26, the cathodes of the light-emitting elements D of the sub-pixels constitute an integral structure. In some embodiments, the cathodes of the light-emitting elements D of the sub-pixels of the plurality of pixels P are all integrally formed and act as an integral structure covering the light-transmitting areas TA and the display areas DA of the plurality of pixels P. Subsequently, an encapsulation layer 160 is formed on the cathode layer 150. The encapsulation layer 160 is, for example, a laminated structure including an inorganic material/an organic material/an inorganic material. In some embodiments, the cathode layer 150 may be electrically connected to the second power line VSSL in various ways, such as a hole formed by laser. In some embodiments, the cathode layer 150 may be electrically connected to the second power line VSSL through a via hole. The anode layer may be formed in the via hole to form a connecting electrode to electrically connect the second power line VSSL and the cathode. In some embodiments, the cathode 150 substantially covers the entire surface of the base substrate 10. There are peripheral wirings in the peripheral area of the display panel, and the peripheral wirings are also connected to the VSS voltage signal. In the peripheral area of the display panel, the cathode layer 150 is electrically connected to the peripheral wirings. After this process, in some embodiments, the light-transmitting area TA may include a base substrate 10 as well as a first insulating layer 30, a third insulating layer 70, a fourth insulating layer 90, a cathode layer 150 and an encapsulation layer 160 disposed on the base substrate 10. Those skilled in the art may understand that the first insulating layer 30, the third insulating layer 70, the fourth insulating layer 90, the cathode layer 150, and the encapsulation layer 160 in the light-transmitting area TA are not necessary. In some embodiments, in the formation process of the above-mentioned layers, the above-mentioned layers in the light-transmitting area TA may be removed according to actual needs.

In some embodiments, the light-transmitting area TA of the pixel P is surrounded by a first gate line GL1, a second gate line GL2, a second power line VSSL corresponding to the pixel P, and a first power line VDDL corresponding to another pixel P adjacent to the pixel P.

Some embodiments of the present disclosure provide an electronic device, specifically a transparent electronic device including the transparent display panel described in any of the embodiments. The transparent electronic device may be used for products or components with see-through and display functions, such as see-through shop windows, vehicle windows, etc.

The above description is only some embodiments of the present disclosure and an explanation of the applied technical principles. Those skilled in the art should understand that the scope of the contents involved in the present disclosure is not limited to the technical solutions formed by the specific combination of the above technical features, and should also cover other technical solutions formed by any combination of the above technical features and equivalent features thereof without departing from the inventive concept, for example, a technical solution formed by replacing the above-mentioned features with the technical features having similar functions which are disclosed in this disclosure (but not limited to this).

What is claimed is:

1. A display panel, comprising:
   a base substrate; and
   a plurality of pixels arranged in an array on the base substrate, the plurality of pixels comprising a first pixel and a second pixel,
   wherein the first pixel comprises a first light-transmitting area and a first display area that are sequentially arranged in a first direction, and the second pixel comprises a second light-transmitting area and a second display area that are sequentially arranged in the first direction, the first pixel and the second pixel are adjacent in a second direction substantially perpendicular to the first direction, and the first light-transmitting area and the second light- transmitting area are adjacent in the second direction;
   wherein the display panel further comprises:
   a first gate line and a second gate line both arranged between the first light-transmitting area and the second light-transmitting area that are adjacent in the second direction, and the first gate line and the second gate line both extend in the first direction,
   wherein the first light-transmitting area is contiguous to the first gate line, and the second light-transmitting area is contiguous to the second gate line;
   wherein the display panel further comprises:
   a wiring area arranged between the first light-transmitting area and the second light-transmitting area adjacent to each other,
   a length of the wiring area in the first direction, a length of the first light-transmitting area in the first direction and a length of the second light-transmitting area in the first direction are equal to each other, the wiring area is aligned with and is contiguous to the first light-transmitting area and the second light-transmitting area adjacent to each other, and the first gate line and the second gate line both pass through the wiring area in the first direction; and wherein the display panel comprises a planarization layer and a pixel defining layer sequentially disposed on the base substrate, and an orthographic projection of the planarization layer on the base substrate and an orthographic projection of the pixel defining layer on the base substrate overlap none of an orthographic projection of the first light- transmitting area on the base substrate, an orthographic projection of the second light- transmitting area on the base substrate, and an orthographic projection of the wiring area on the base substrate.

2. The display panel according to claim 1, wherein there is a gap between the first gate line and the second gate line, and the display panel further comprises a light-shielding layer between the first light-transmitting area and the second light-transmitting area adjacent to each other, and an orthographic projection of a part of the gap located in the wiring area on the base substrate falls within an orthographic projection of the light-shielding layer on the base substrate.

3. The display panel according to claim 2, wherein the first gate line and the second gate line are arranged in the same layer, and the light-shielding layer is located in a different layer from the first gate line and the second gate line.

4. The display panel according to claim 3, wherein the light-shielding layer is located on a side of the first gate line and the second gate line facing the base substrate.

5. The display panel according to claim 2, wherein a width of the wiring area in the second direction is greater than or equal to a width of the light-shielding layer in the second direction.

6. The display panel according to claim 2, wherein a length of the light-shielding layer in the first direction is greater than or equal to the length of the wiring area in the first direction.

7. The display panel according to claim 2, wherein the orthographic projection of the light-shielding layer on the base substrate does not overlap either of the orthographic projection of the first light-transmitting area on the base substrate and the orthographic projection of the second light-transmitting area on the base substrate.

8. The display panel according to claim 2, wherein a material of the light-shielding layer contains an opaque metal material.

9. The display panel according to claim 2, further comprising:
a gate insulating layer disposed on the side of the first gate line and the second gate line facing the base substrate and on a side of the light-shielding layer away from the base substrate, wherein in the wiring area, the gate insulating layer comprises a first part and a second part, an orthographic projection of the first part on the base substrate coincides with an orthographic projection of the first gate line on the base substrate, and an orthographic projection of the second part on the base substrate coincides with an orthographic projection of the second gate line on the base substrate.

10. The display panel according to claim 2, further comprises a second power line,
wherein the second power line extends in the second direction, the second power line is configured to provide a constant voltage to the first pixel and the second pixel, and the light-shielding layer is electrically connected to the second power line through a via hole.

11. The display panel according to claim 10, wherein the light-shielding layer is provided with an extension portion extending from an overlap of the light-shielding layer and the second power line in the second direction, and an orthographic projection of the via hole on the base substrate falls within an orthographic projection of the extension portion on the base substrate.

12. The display panel according to claim 11, wherein the extension portion extends from the overlap of the light-shielding layer and the second power line toward the first pixel.

13. The display panel according to claim 11, wherein the extension portion extends from the overlap of the light-shielding layer and the second power line toward the second pixel.

14. The display panel according to claim 10, wherein the second power line provides a VSS voltage signal.

15. The display panel according to claim 1, wherein the first pixel further comprises a sub-pixel driving circuit located in the first display area, and the second pixel further comprises a sub-pixel driving circuit located in the second display area, the first gate line is electrically connected to the sub-pixel driving circuit of the first pixel to provide a first control signal to the first pixel, and the second gate line is electrically connected to the sub-pixel driving circuit of the second pixel to provide a second control signal to the second pixel.

16. The display panel according to claim 1, wherein the display panel is an OLED display panel.

17. An electronic device comprising the display panel according to claim 1.

18. The display panel according to claim 1, wherein there is a gap between the first gate line and the second gate line, and the display panel further comprises a light-shielding layer between the first light-transmitting area and the second light-transmitting area adjacent to each other, and an orthographic projection of a part of the gap located in the wiring area on the base substrate falls within an orthographic projection of the light-shielding layer on the base substrate.

* * * * *